US012681045B2

(12) United States Patent
Huang et al.

(10) Patent No.: US 12,681,045 B2
(45) Date of Patent: Jul. 14, 2026

(54) PROBE CARD, AND SUPPORTING STRUCTURE AND PROBE STRUCTURE THEREOF

(71) Applicant: STAR TECHNOLOGIES, INC., Hsinchu City (TW)

(72) Inventors: Hung-Chan Huang, Hsinchu City (TW); Yuan-Ting Tai, Hsinchu City (TW)

(73) Assignee: STAR TECHNOLOGIES, INC., Hsinchu City (TW)

( * ) Notice: Subject to any disclaimer, the term of this patent is extended or adjusted under 35 U.S.C. 154(b) by 455 days.

(21) Appl. No.: 18/320,135

(22) Filed: May 18, 2023

(65) Prior Publication Data

US 2024/0319230 A1 Sep. 26, 2024

(30) Foreign Application Priority Data

Mar. 24, 2023 (TW) .................................. 112111231

(51) Int. Cl.

| *G01R 1/073* | (2006.01) |
| *G01R 1/02* | (2006.01) |
| *G01R 1/04* | (2006.01) |
| *G01R 1/067* | (2006.01) |
| *G01R 1/20* | (2006.01) |
| *G01R 3/00* | (2006.01) |
| *G01R 31/02* | (2006.01) |
| *G01R 31/26* | (2020.01) |

(52) U.S. Cl.
CPC ..... *G01R 1/07342* (2013.01); *G01R 1/07364* (2013.01)

(58) Field of Classification Search
CPC . G01R 1/02; G01R 1/04; G01R 1/067; G01R 1/073; G01R 1/20; G01R 3/00; G01R 31/02; G01R 31/26; G01R 31/31
See application file for complete search history.

(56) References Cited

U.S. PATENT DOCUMENTS 10,274,516 B2 * 4/2019 Liao ................... G01R 31/2889
2020/0348337 A1 * 11/2020 Vettori .............. G01R 1/07342

FOREIGN PATENT DOCUMENTS

| CN | 104142413 B | 4/2017 |
| TW | 201017179 A | 5/2010 |
| TW | I391670 B | 4/2013 |

* cited by examiner

*Primary Examiner* — Neel D Shah

(74) *Attorney, Agent, or Firm* — Muncy, Geissler, Olds & Lowe, P.C.

(57) ABSTRACT

The present disclosure provides a probe card, and a supporting structure and probe structure thereof. The probe card includes: a substrate, the supporting structure and a probe structure. The supporting structure includes: a main body and a protrusion part. The probe structure includes a plurality of cantilever probes. The main body has a main opening and is disposed on the substrate. The protrusion part is configured to support the cantilever probes, is disposed on the main body and protrude toward to an inner of the main opening for forming a stepped channel in the opening.

18 Claims, 36 Drawing Sheets

S10/S10-6

S10/S10-4

S10/S10-2

S10/S10-5

S10/S10-3

S10/S10-1

13

S20/S20-6

S20/S20-4

S20/S20-5

S20/S20-2

S20/S20-3

S20/S20-1

23

S30/S30-6

S30/S30-4

S30/S30-5

S30/S30-2

S30/S30-3

S30/S30-1

33

C41/C51  C42/C52

C43/C53

C44/C54

C45/C55

C46/C56

C47/C57

43/53

S40/S40-6
S50/S50-6

S40/S40-4
S50/S50-4

S40/S40-5
S50/S50-5

S40/S40-2
S50/S50-2

S40/S40-3
S50/S50-3

S40/S40-1
S50/S50-1

43

PROBE CARD, AND SUPPORTING STRUCTURE AND PROBE STRUCTURE THEREOF

CROSS REFERENCE TO RELATED APPLICATION

This application claims priority of Taiwan application No. 112111231 filed on Mar. 24, 2023, which is incorporated by reference in its entirety.

TECHNICAL FIELD

The present disclosure relates to a probe card, and a supporting structure and probe structure thereof, and more particularly to a probe card including cantilever probes, and a supporting structure and probe structure thereof.

DISCUSSION OF THE BACKGROUND

According to prior art, a probe card uses a plurality of probes to conduct an electrical test on a wafer. To meet different testing needs, R&D was carried out to develop different types of probe cards, among which is a cantilever probe card (CPC) with cantilever-shaped probes. Owing to the unique probe structure of the cantilever probe card, the design of the cantilever probe card has to take installation space into account and give considerations to whether the probes interfere with each other in each unique testing environment.

The above description of the prior art merely serves to reveal background technology but is not intended to acknowledge that the above description of the prior art discloses the subject matters of the disclosure, is intended to constitute the prior art of the disclosure, or is intended to be any part of the disclosure.

SUMMARY

An embodiment of the disclosure provides a probe card. The probe card includes a substrate, a supporting structure, a plurality of first cantilever probes and a plurality of second cantilever probes. The supporting structure is disposed on the substrate and includes a first layer, a second layer and a plurality of protrusion portions. The first layer has a first opening. The second layer has a second opening. The protrusion portions are disposed between the first layer and the second layer and protrude toward the inside of the first opening and the inside of the second opening. The probe structure is electrically connected to the substrate and includes a plurality of first cantilever probes and a plurality of second cantilever probes. The first cantilever probes each protrude and hang from an edge of a corresponding one of the protrusion portions. The first cantilever probes protrude and hang from the edges of the protrusion portions by the same length. The second cantilever probes each protrude and hang from an edge of the second layer. The second cantilever probes protrude and hang from the edge of the second layer by the same length.

An embodiment of the disclosure provides a supporting structure. The supporting structure includes a body and a plurality of protrusion portions. The body includes: a first layer having a first opening; and a second layer having a second opening. The first opening and the second opening together form a main opening. The protrusion portions support a plurality of cantilever probes, are disposed at the body and protrude toward the inside of the main opening, allowing a stepped channel to be formed in the main opening.

An embodiment of the disclosure provides a probe structure. The probe structure includes a plurality of first cantilever probes and a plurality of second cantilever probes. The first cantilever probes are each disposed along one side of a corresponding one of a plurality of protrusion portions of a supporting structure. The protrusion portions protrude toward an inside of a main opening of the supporting structure, and the first cantilever probes each protrude and hang from the side of the corresponding one of the protrusion portions. The second cantilever probes are disposed on the supporting structure and along other sides of the protrusion portions, respectively, and protrude and hanging from an edge of the supporting structure.

The above description extensively explains the technical features and advantages of the disclosure to render the detailed description below comprehensible. The other advantages and technical features which define the claims of the disclosure are described below. Persons skilled in the art understand that objectives identical to the ones of the disclosure can be easily achieved by changing or designing the other structures or processes in accordance with concepts and specific embodiments disclosed hereunder. Persons skilled in the art also understand that the aforesaid equivalent construction cannot depart from the spirit and scope of the appended claims of the disclosure.

BRIEF DESCRIPTION OF THE DRAWINGS

Persons skilled in the art can gain insight into the disclosure by referring to the embodiments, claims and drawings of the disclosure. In the drawings, like components are denoted by like reference numerals.

DETAILED DESCRIPTION

Figure 1A:
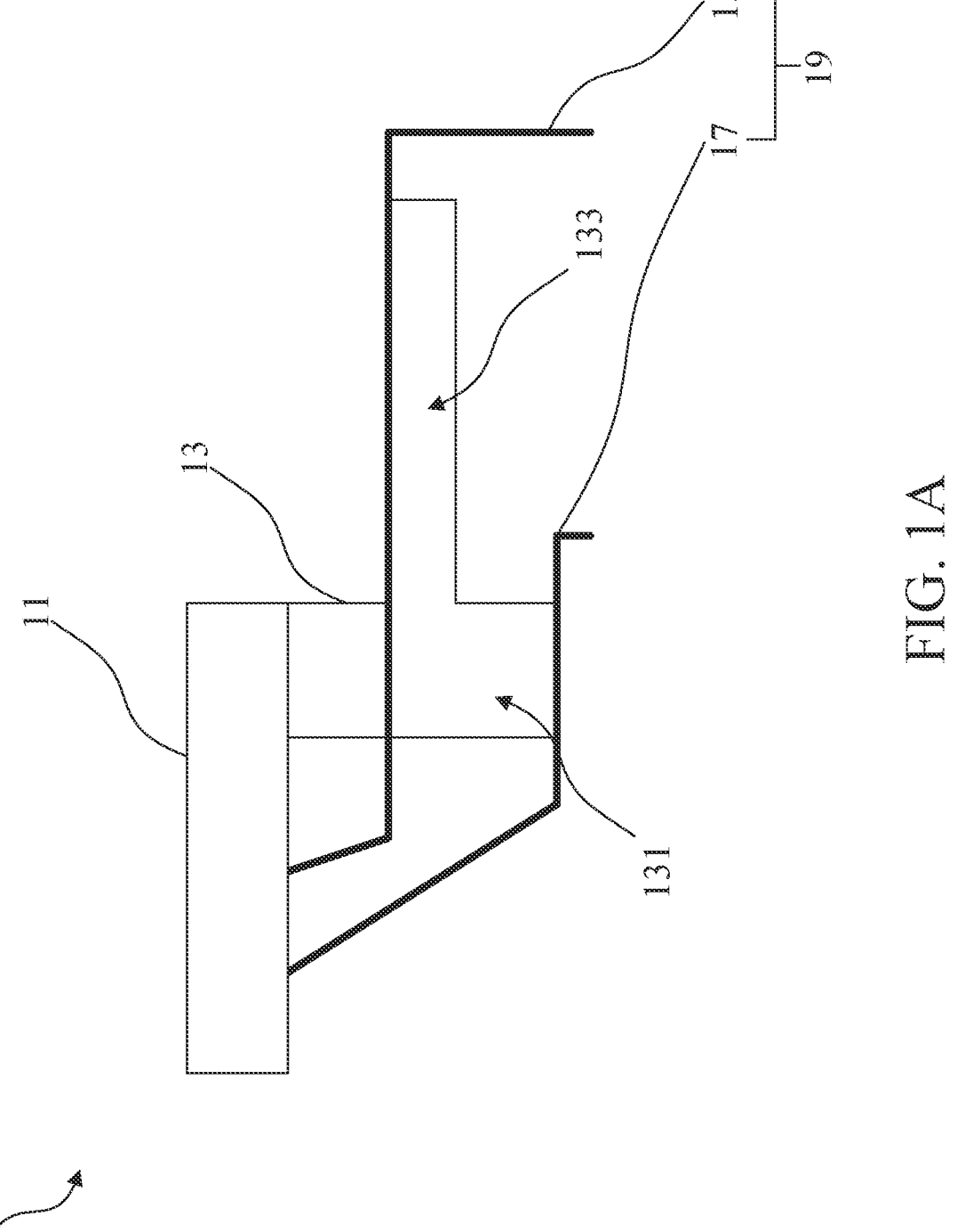
FIG. 1A is a schematic view illustrative of the positions of elements of a probe card relative to each other according to some embodiments of the disclosure.

The following description of the present disclosure is accompanied by figures that are incorporated into and constitute a part of the specification to illustrate embodiments of the present disclosure, but the present disclosure is not limited to the embodiments. In addition, the following embodiments can be appropriately integrated to complete another embodiment.

Terms such as "one embodiment," "embodiment," "exemplary embodiment," "other embodiments," "another embodiment," etc. indicate that the embodiments described in this disclosure may include specific features, structures or characteristics. However, not every embodiment has to include the specific features, structures or characteristics. Furthermore, repeated use of the term "in an embodiment" does not necessarily refer to a same embodiment, although it may.

In order to make the present disclosure fully understandable, the following description provides detailed steps and structures. Obviously, specific details known to those skilled in the art are not limited by implementation of the present disclosure. In addition, known structures and steps will not be described in detail, so as not to unnecessarily limit the present disclosure. Preferred embodiments of the present disclosure are described in detail as follows. However, in addition to detailed descriptions, the present disclosure can also be widely implemented in other embodiments. The scope of this disclosure is not limited to the content of the detailed description, but is defined by the appended claims.

It should be realized that the following disclosure provides many different embodiments, or examples, for implementing different features of the provided subject matter. Specific examples of components and arrangements are described below to simplify the present disclosure. These are, of course, merely examples and are not intended to be limiting. For example, sizes of elements are not limited to the disclosed range or value, but may depend on process conditions and/or desired properties of a device. In addition, formation of a first feature over or on a second feature in the description that follows may include embodiments in which the first and second features are formed in direct contact, and may also include embodiments in which additional features may be formed between the first and second features, such that the first and second features may not be in direct contact. For sake of brevity and clarity, dimensions of the various features may be arbitrarily increased or reduced. In the figures, some layers or features may be omitted for simplicity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A probe card provided by an embodiment of the disclosure includes a plurality of cantilever probes and a supporting structure. The supporting structure has a body and protrusion portions. The body has a main opening. The protrusion portions are disposed at the body and protrude toward the inside of the main opening, allowing a substantially stepped channel to be formed in the main opening. The protrusion portions support the plurality of cantilever probes. The plurality of cantilever probes can be configured to simultaneously test multiple rows of obliquely-arranged devices under test (DUT) and effectively prevent probe collisions because of the shape of the main opening, the presence of the protrusion portions, and the stepped channel formed by the protrusion portions in the main opening. Related fine structures and explanations thereof are illustrated by the embodiments below.

Figure 1B:
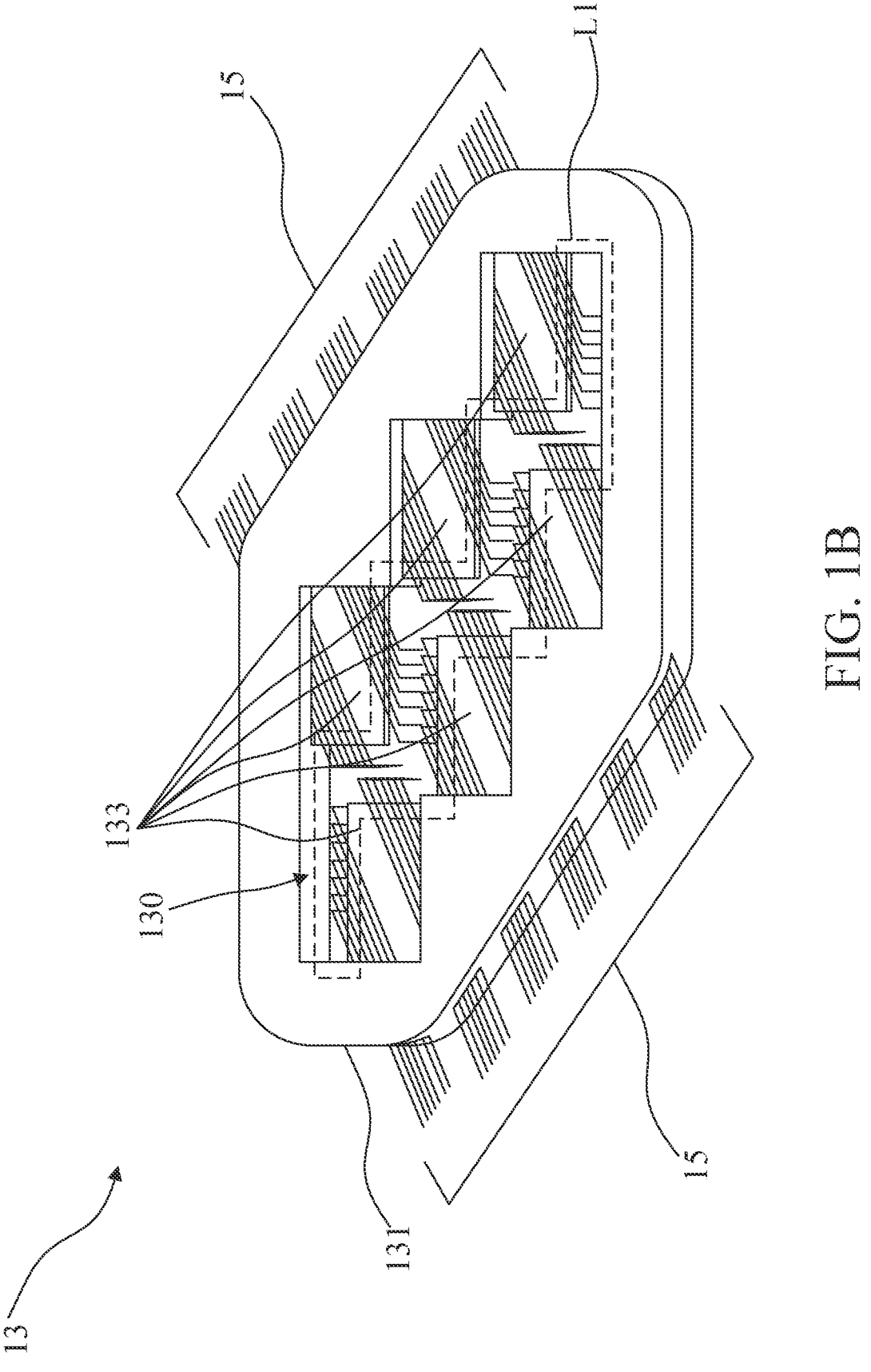
FIG. 1B and FIG. 1C are schematic views of a supporting structure carrying cantilever probes according to some embodiments of the disclosure.
Figure 1C:
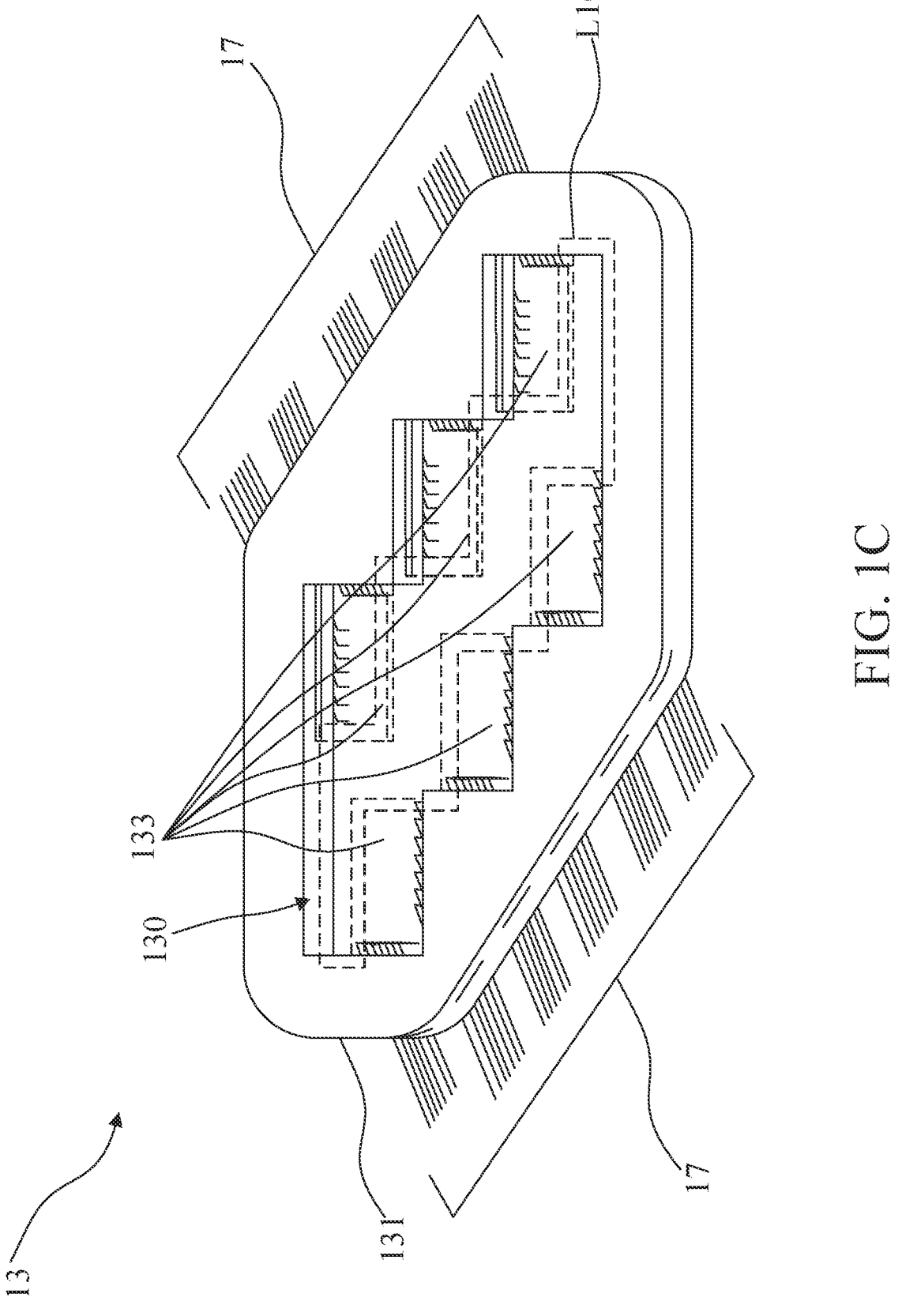

Refer to FIG. 1A through FIG. 1C. FIG. 1A is a schematic view illustrative of the positions of elements of a probe card 1 relative to each other according to some embodiments of the disclosure. The probe card 1 includes a substrate 11, a supporting structure 13 and a probe structure 19. The probe structure 19 includes a plurality of first cantilever probes 15 and a plurality of second cantilever probes 17. FIG. 1B and FIG. 1C are schematic views of the supporting structure 13 carrying the first cantilever probes 15 and the second cantilever probes 17 according to some embodiments of the disclosure. For exemplary purposes, FIG. 1B shows how to carry the first cantilever probes 15, and FIG. 1C shows how to carry the second cantilever probes 17. As shown in the diagrams, the supporting device 13 actually carries the first cantilever probes 15 and the second cantilever probes 17 simultaneously.

In some embodiments, the supporting structure 13 is disposed on the substrate 11 and includes a body 131 and a plurality of protrusion portions 133. The body 131 has a main opening 130. The protrusion portions 133 are disposed at the body 131 and protrude toward the inside of the main opening 130, allowing a stepped channel L10 (demarcated by the dashed line in FIG. 1B) to be formed in the main opening 130. One end of each of the first cantilever probes 15 is electrically connected to the substrate 11 and disposed along a surface (facing the substrate 11) of a corresponding one of the protrusion portions 133. The other end of the first cantilever probe 15 protrudes from an edge of the surface of the protrusion portion 133 and hangs within the stepped channel 110. Thus, the protrusion portions 133 support the first cantilever probes 15, and the first cantilever probes 15 pass through the stepped channel L10 to come into contact with a DUT zone (not shown). One end of each of the second cantilever probes 17 is electrically connected to the substrate 11 and disposed along a surface (facing the DUT) of the body 131. The other end of the second cantilever probe 17 protrudes from an edge of the surface of the body 131 and hangs to come into contact with the DUT zone.

In some embodiments, as shown in the diagrams, the body 131 can be slotted or perforated to receive the first cantilever probes 15 such that the first cantilever probes 15 can be configured to pass through the slots or holes of the body 131 and then be disposed along the surfaces of the protrusion portions 133.

Figure 1D:
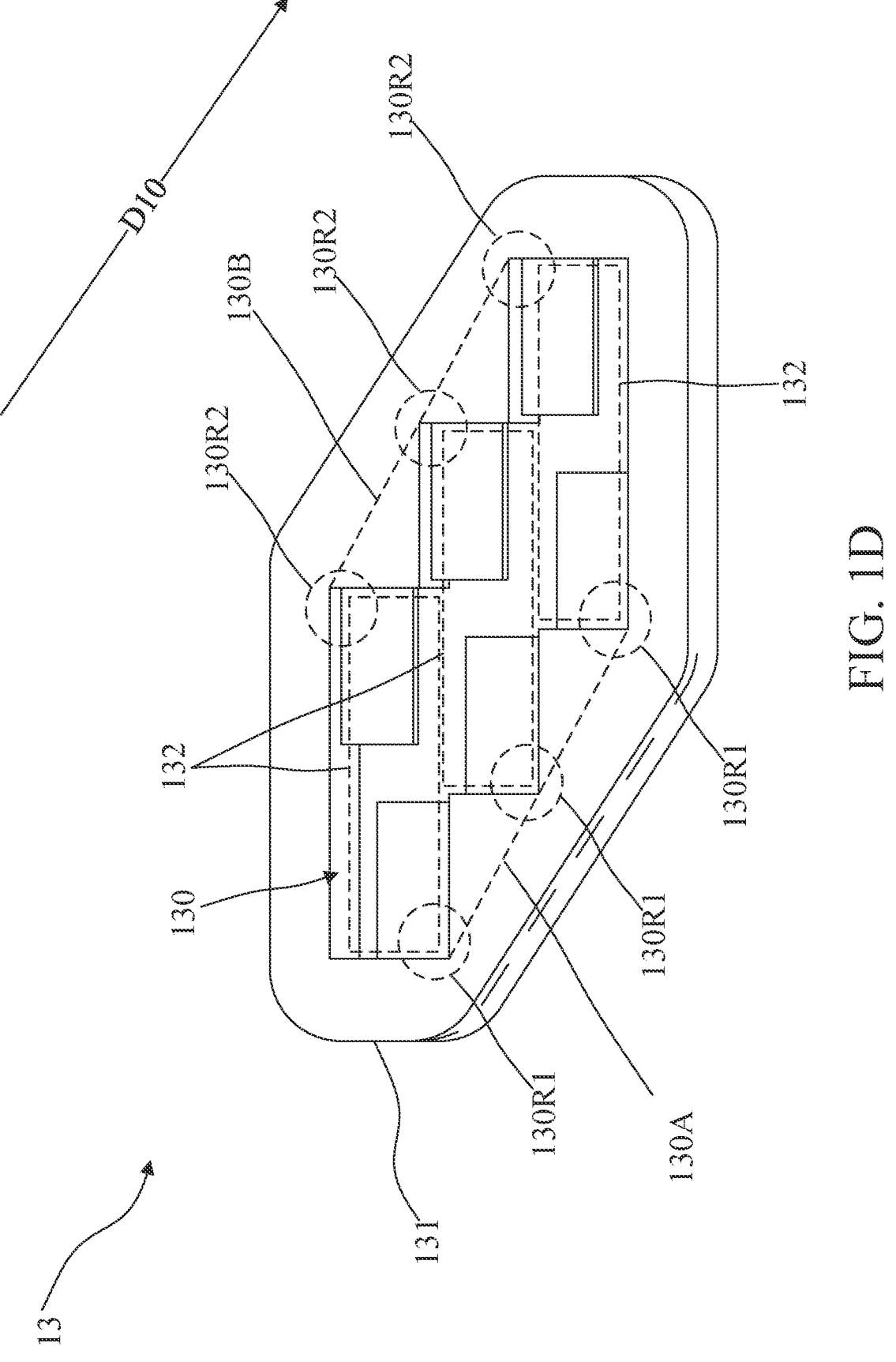
FIG. 1D is a schematic view of a supporting structure according to some embodiments of the disclosure.
Figure 1E:
FIG. 1E is a top view of a supporting structure according to some embodiments of the disclosure.

Refer to FIG. 1D and FIG. 1E. FIG. 1D is a schematic view of the supporting structure 13 according to some embodiments of the disclosure. FIG. 1E is a top view of the supporting structure 13 according to some embodiments of the disclosure. The main opening 130 substantially extends in direction D10 to become elongated. Two long sides 130A and 130B of the main opening 130 each take on a stepped shape facing inward. The stepped shape of the long side 130A has multiple dents 130R1. The stepped shape of the long side 130B has multiple dents 130R2. Each dent 130R1 and a corresponding one of the dents 130R2 define an elongated zone 132. Multiple elongated zones 132 defined by multiple dents 130R1 and multiple dents 130R2 are staggered in the main opening 130.

The protrusion portions 133 protrude from the dents 130R1 and 130R2 to the main opening 130. Thus, in each elongated zone 132, the protrusion portions 133 protrude diagonally and assist the body 131 in forming supporting blocks S10 of the supporting structure 13. Free ends (not shown in FIG. 1D and FIG. 1E) of the first and second cantilever probes 15 and 17 supported by the supporting blocks S10 are used in testing a DUT zone. Two supporting blocks S10 exist in each elongated zone 132 to test two DUT zones.

With the elongated zones 132 being staggered in the main opening 130, DUT zones can be tested with the free ends of the first and second cantilever probes 15 and 17 (not shown in FIGS. 1D and 1E) supported by multiple rows of obliquely-arranged supporting blocks S10 (for example, obliquely-arranged supporting blocks S10-1, S10-3, S10-5 and obliquely-arranged supporting blocks S10-2, S10-4, S10-6). In some embodiments, the supporting blocks S10-1 and S10-2 can simultaneously correspond in position to two DUTs, and thus two different DUTs can be simultaneously tested with the first and second cantilever probes 15 and 17 on different blocks. In some embodiments, the supporting blocks S10-1, 10-3, 10-5 and the supporting blocks S10-2, 10-4, 10-6 simultaneously correspond in position to two rows of DUTs obliquely arranged. Therefore, two different rows of DUTs can be simultaneously tested with the first and second cantilever probes 15 and 17 on different blocks.

Figure 2A:
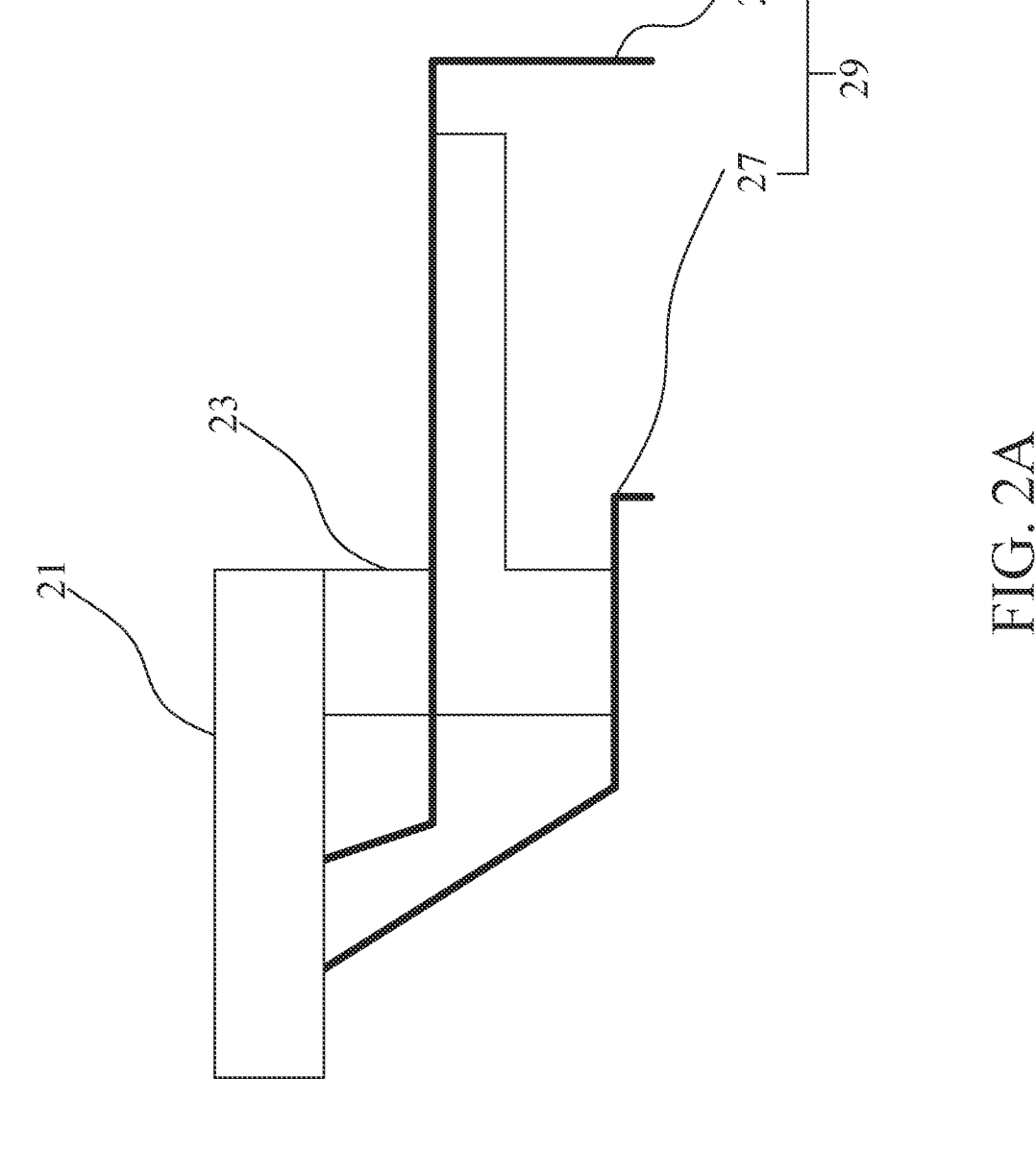
FIG. 2A and FIG. 2B are schematic views illustrative of the positions of elements of a probe card relative to each other according to some embodiments of the disclosure.
Figure 2B:
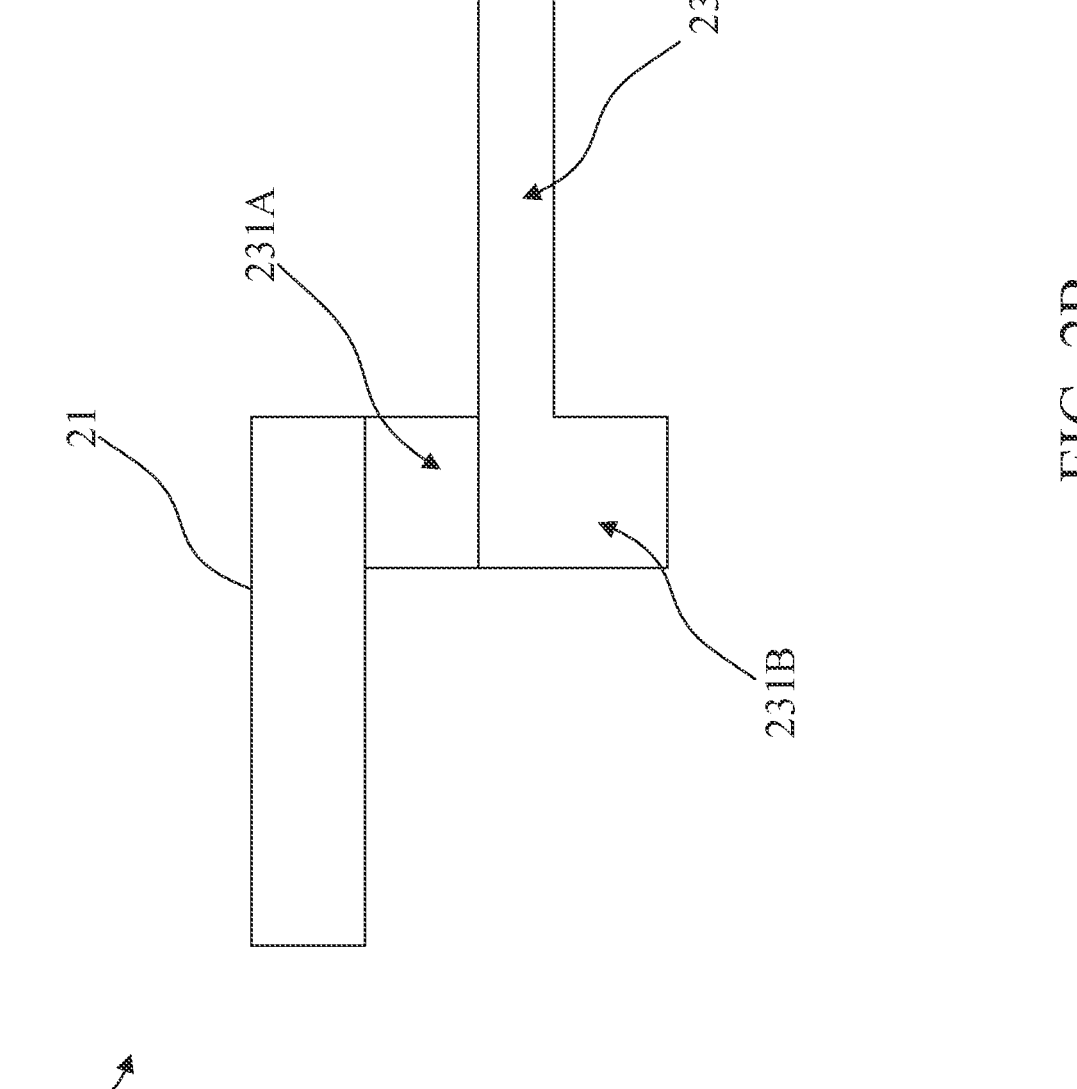
Figure 2C:
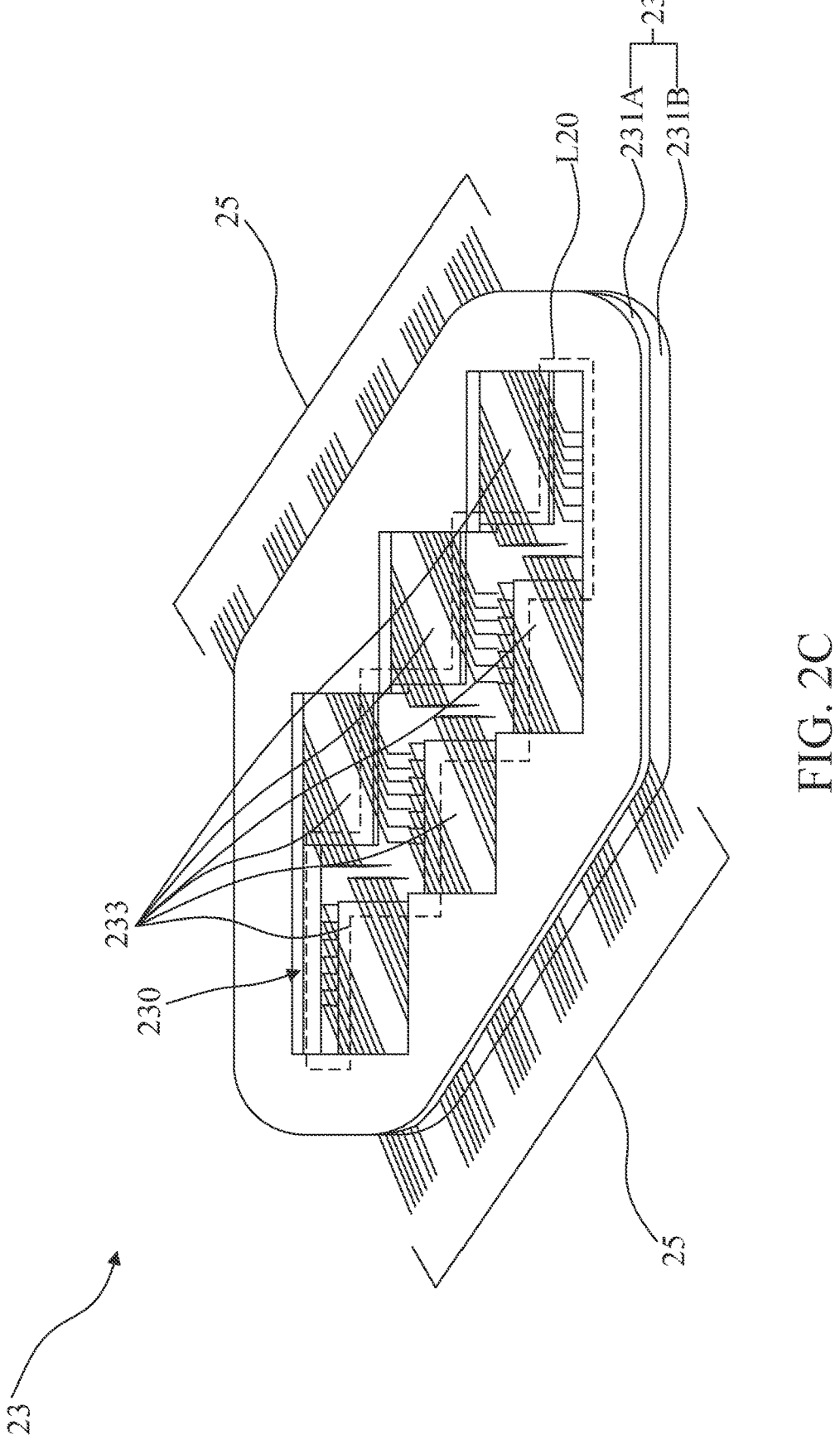
FIG. 2C and FIG. 2D are schematic views of a supporting structure carrying cantilever probes according to some embodiments of the disclosure.
Figure 2D:
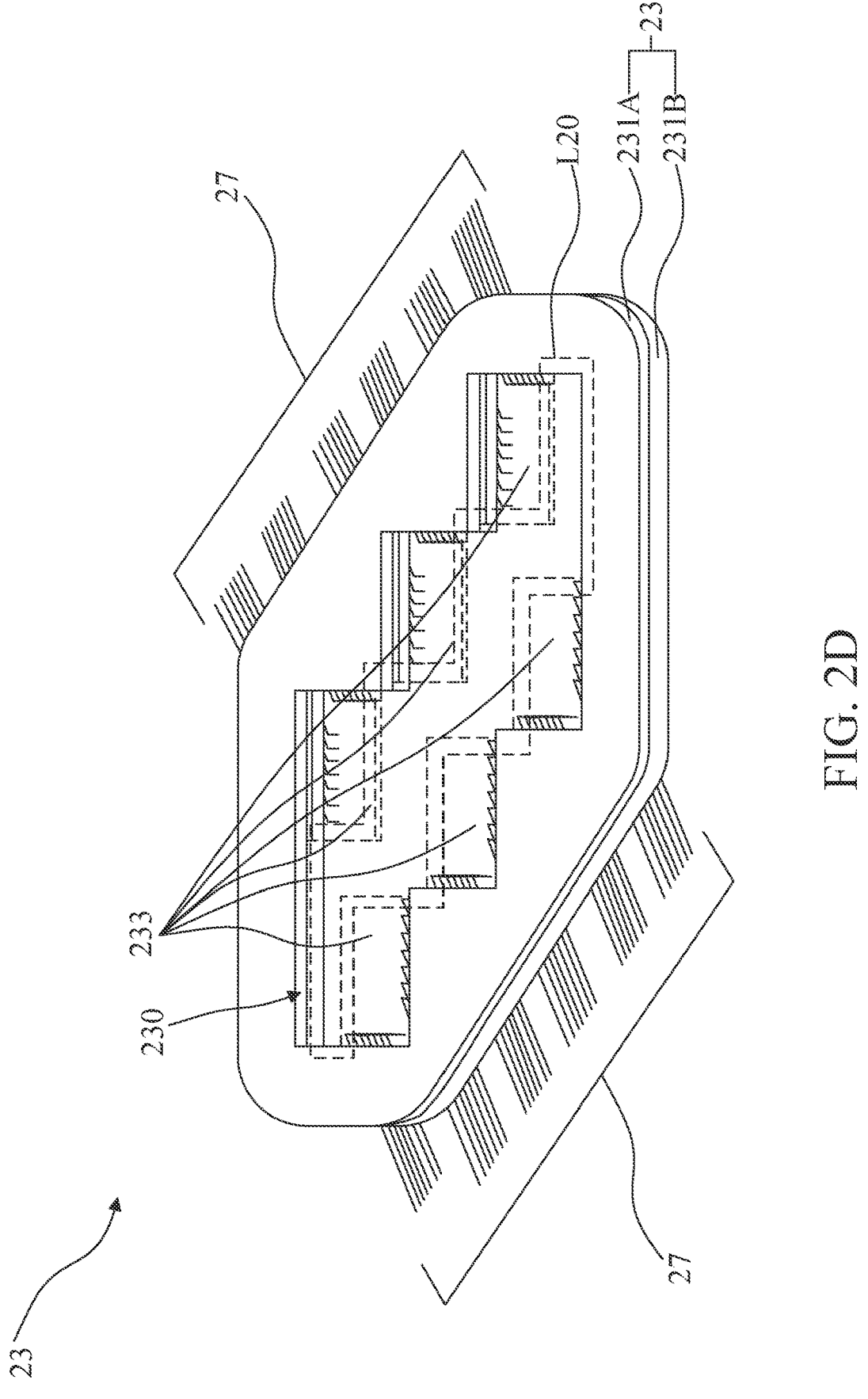
Figure 2E:
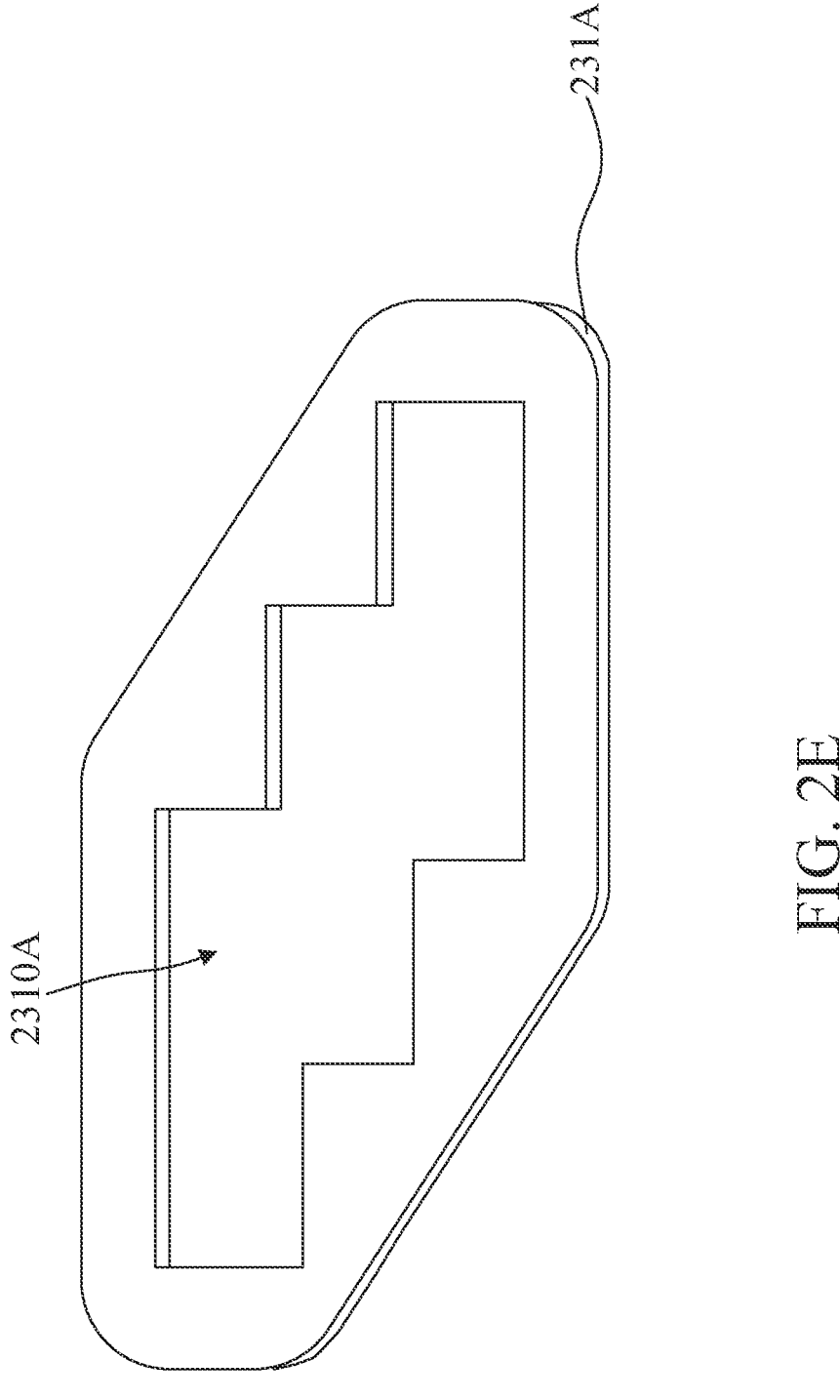
FIG. 2E and FIG. 2F are schematic views of different layers of a supporting structure according to some embodiments of the disclosure.
Figure 2F:
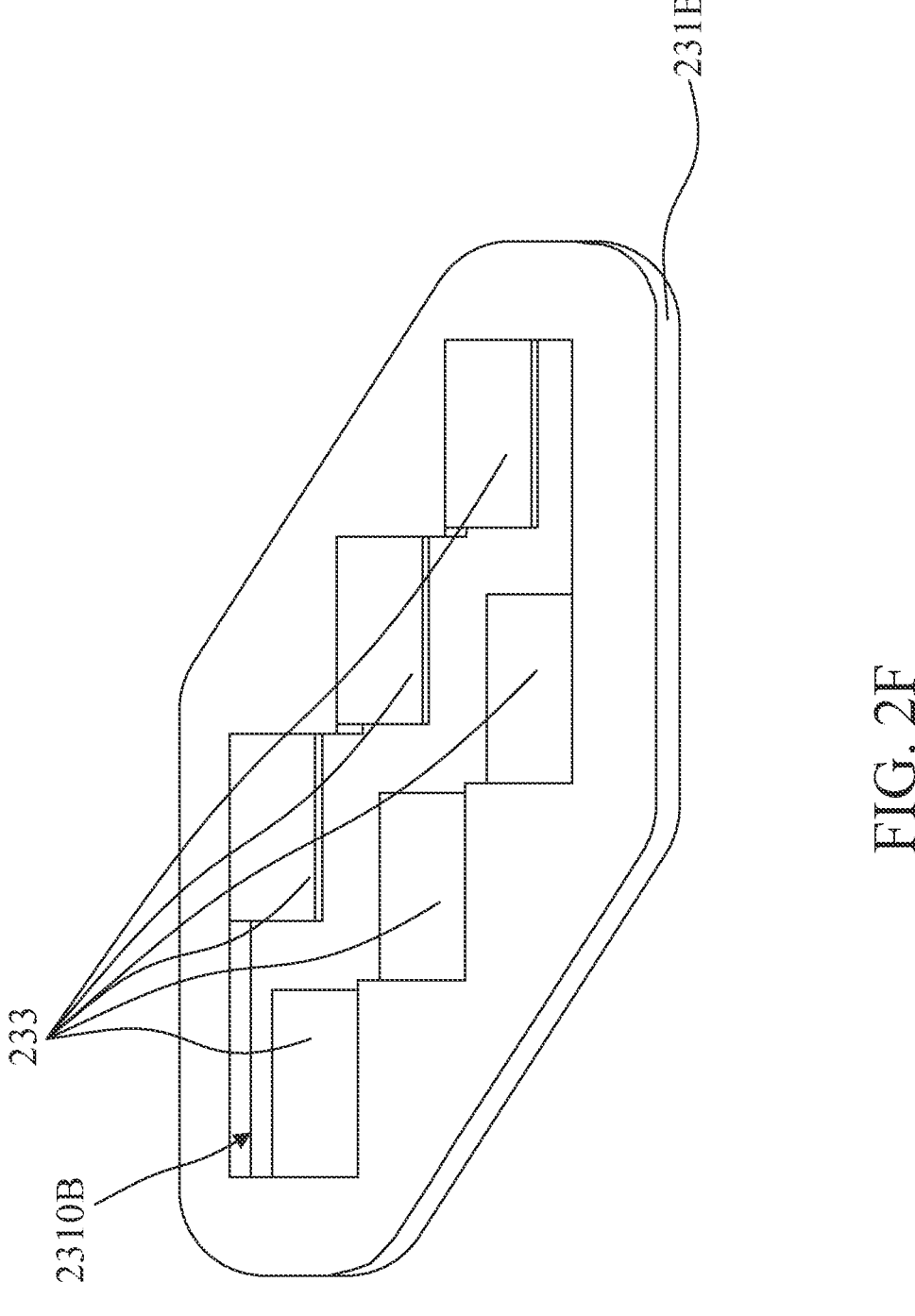

Refer to FIG. 2A through FIG. 2F. FIG. 2A and FIG. 2B are schematic views illustrative of the positions of elements of a probe card 2 relative to each other according to some embodiments of the disclosure. The probe card 2 includes a substrate 21, a supporting structure 23 and a probe structure 29. The probe structure 29 includes a plurality of first cantilever probes 25 and a plurality of second cantilever probes 27. FIG. 2C and FIG. 2D are schematic views of the supporting structure 23 carrying the first cantilever probes 25 and the second cantilever probes 27 according to some embodiments of the disclosure. For exemplary purposes, FIG. 2C shows how to carry the first cantilever probes 25, and FIG. 2D shows how to carry the second cantilever probes 27. As shown in the diagrams, the supporting device 23 actually carries the first cantilever probes 25 and the second cantilever probes 27 simultaneously. FIG. 2E and FIG. 2F are schematic views of a first layer 231A and a second layer 231B of a body 231 of the supporting structure 23 according to some embodiments of the disclosure, respectively.

In some embodiments, the supporting structure 23 is disposed on the substrate 21 and includes the body 231 and a plurality of protrusion portions 233. The body 231 includes the first layer 231A and the second layer 231B. The first layer 231A has a first opening 2310A. The second layer 231B has a second opening 2310B. The first opening and the second opening have the same shape and together form a main opening 230. The protrusion portions 233 are formed on the second layer 231B and protrude toward the inside of the main opening 230, allowing a stepped channel L20 (demarcated by the dashed line in FIG. 2C) to be formed in the main opening 230. Each first cantilever probe 25 not only has one end electrically connected to the substrate 21 but is also disposed along a surface (facing the substrate 21) of a corresponding one of the protrusion portions 233 and between the first layer 231A and the second layer 231B. The other end of each first cantilever probe 25 protrudes and hangs from the edge of the surface of the protrusion portion 233 and hangs within the stepped channel L20. Thus, the protrusion portions 233 support the first cantilever probes 25, and the first cantilever probes 25 pass through the stepped channel L20 to come into contact with a DUT zone (not shown). Each second cantilever probe 27 not only has one end electrically connected to the substrate 21 but is also disposed on the second layer 231B and along a surface (facing the DUT) of the second layer 231B of the body 231. The other end of each second cantilever probe 27 protrudes and hangs from the edge of the surface of the second layer 231B of the body 231 to come into contact with the DUT zone.

Figure 2G:
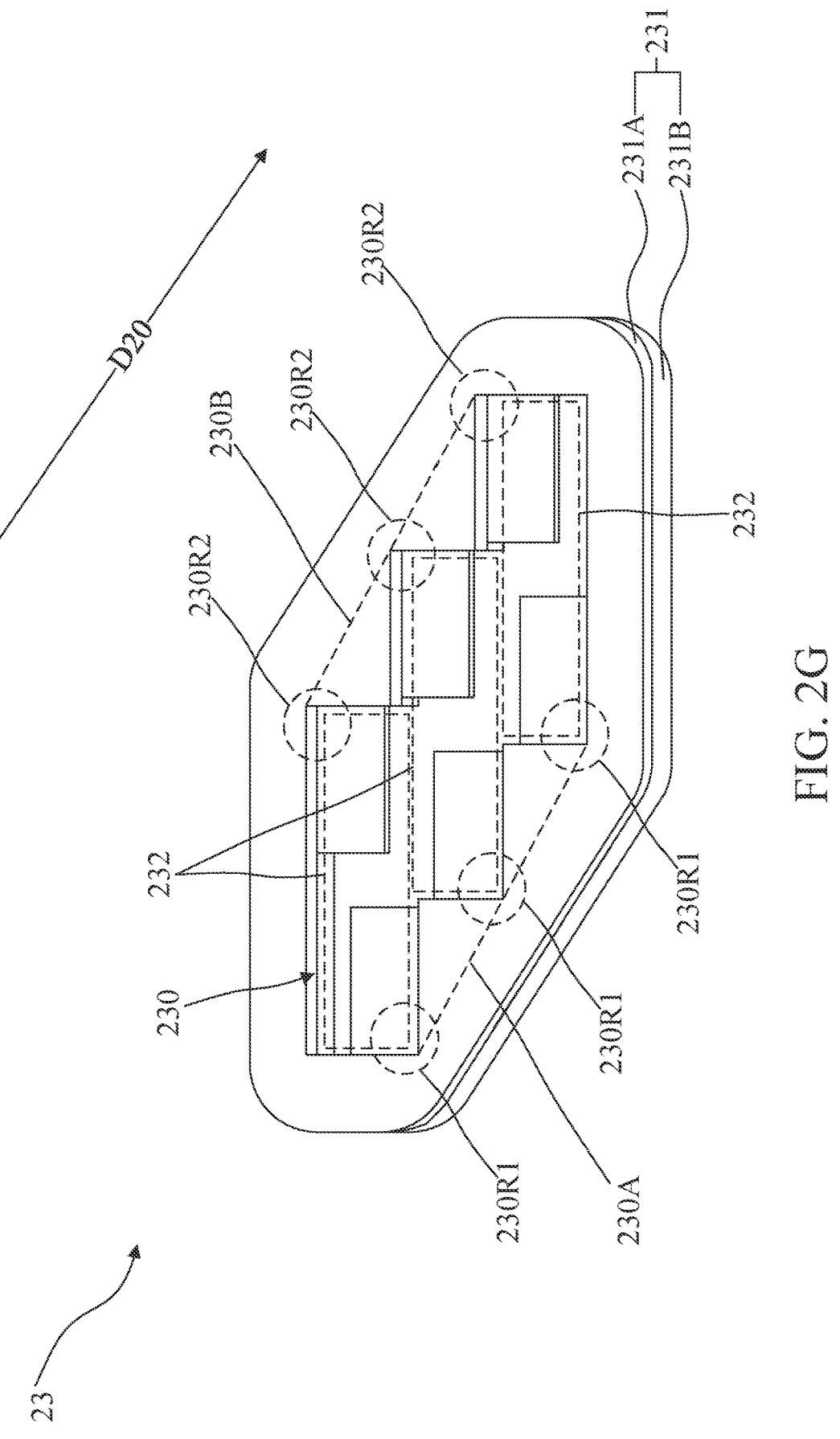
FIG. 2G is a schematic view of a supporting structure according to some embodiments of the disclosure.
Figure 2H:
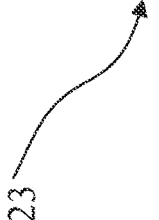
FIG. 2H is a top view of a supporting structure according to some embodiments of the disclosure.

Refer to FIG. 2G and FIG. 2H. FIG. 2G is a schematic view of the supporting structure 23 according to some embodiments of the disclosure. FIG. 2H is a top view of the supporting structure 23 according to some embodiments of the disclosure. The main opening 230 substantially extends in direction D20 to become elongated. Two long sides 230A and 230B of the main opening 230 each take on a stepped shape facing inward, forming the stepped channel L20 which extends in a lengthwise direction of the main opening 230. The stepped shape of the long side 230A has multiple dents 230R1. The stepped shape of the long side 230B has multiple dents 230R2. Each dent 230R1 and a corresponding one of the dents 230R2 define an elongated zone 232. The multiple elongated zones 232 defined by the multiple dents 230R1 and the multiple dents 230R2 are staggered in the main opening 230.

Preferably, on the long side 230A, the first layer 231A is in a stepped shape in the first opening, and the second layer 231B is in a stepped shape in the second opening, allowing the stepped shape of the second layer 231B in the second opening and the stepped shape of the first layer 231A in the first opening to be identical in shape and correspond to each other in position. On the long side 230B, the first layer 231A is in a stepped shape in the first opening, and the second layer 231B is in a stepped shape in the second opening, allowing the stepped shape of the second layer 231B in the second opening and the stepped shape of the first layer 231A in the first opening to be identical in shape and correspond to each other in position. The stepped shapes of the first layer 231A and the second layer 231B on the long side 230A have multiple dents 230R1 which are identical in shape and correspond to each other in position. The stepped shapes of the first layer 231A and the second layer 231B on the long side 230B have the multiple dents 230R2 which are identical in shape and correspond to each other in position.

The protrusion portions 233 protrude from the dents 230R1 and 230R2 toward the main opening 230. Thus, in each elongated zone 232, the protrusion portions 233 protrude diagonally and each form a supporting block S20 of the supporting structure 23 together with the body 231, and the free ends (not shown in FIG. 2E and FIG. 2F) of the cantilever probes 25 and 27 supported by each supporting block S20 are for use in testing a DUT zone. Since each elongated zone 232 has therein two supporting blocks S20, the two supporting blocks S20 of each elongated zone 232 can test two DUT zones.

Since the elongated zones 232 in the main opening 230 are staggered, the cantilever probes 25 and 27 (not shown in FIG. 2E and FIG. 2F) supported by the supporting blocks S20 can be configured to use the free ends to test multiple rows of DUTs arranged obliquely (for example, obliquely-arranged supporting blocks S20-1, S20-3, S20-5 and obliquely-arranged supporting blocks S20-2, S20-4, S20-6).

Figure 3A:
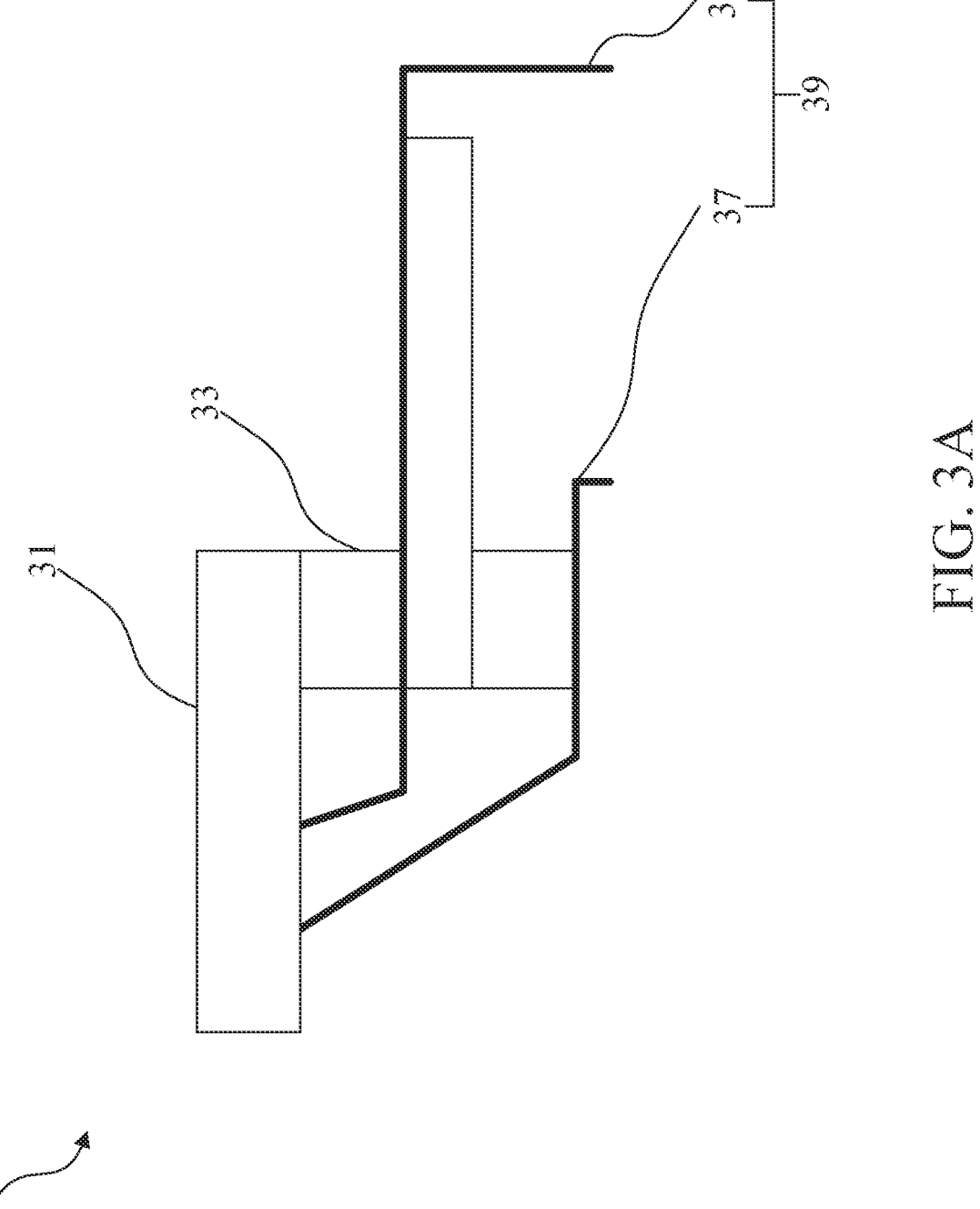
FIG. 3A and FIG. 3B are schematic views illustrative of the positions of elements of a probe card relative to each other according to some embodiments of the disclosure.
Figure 3B:
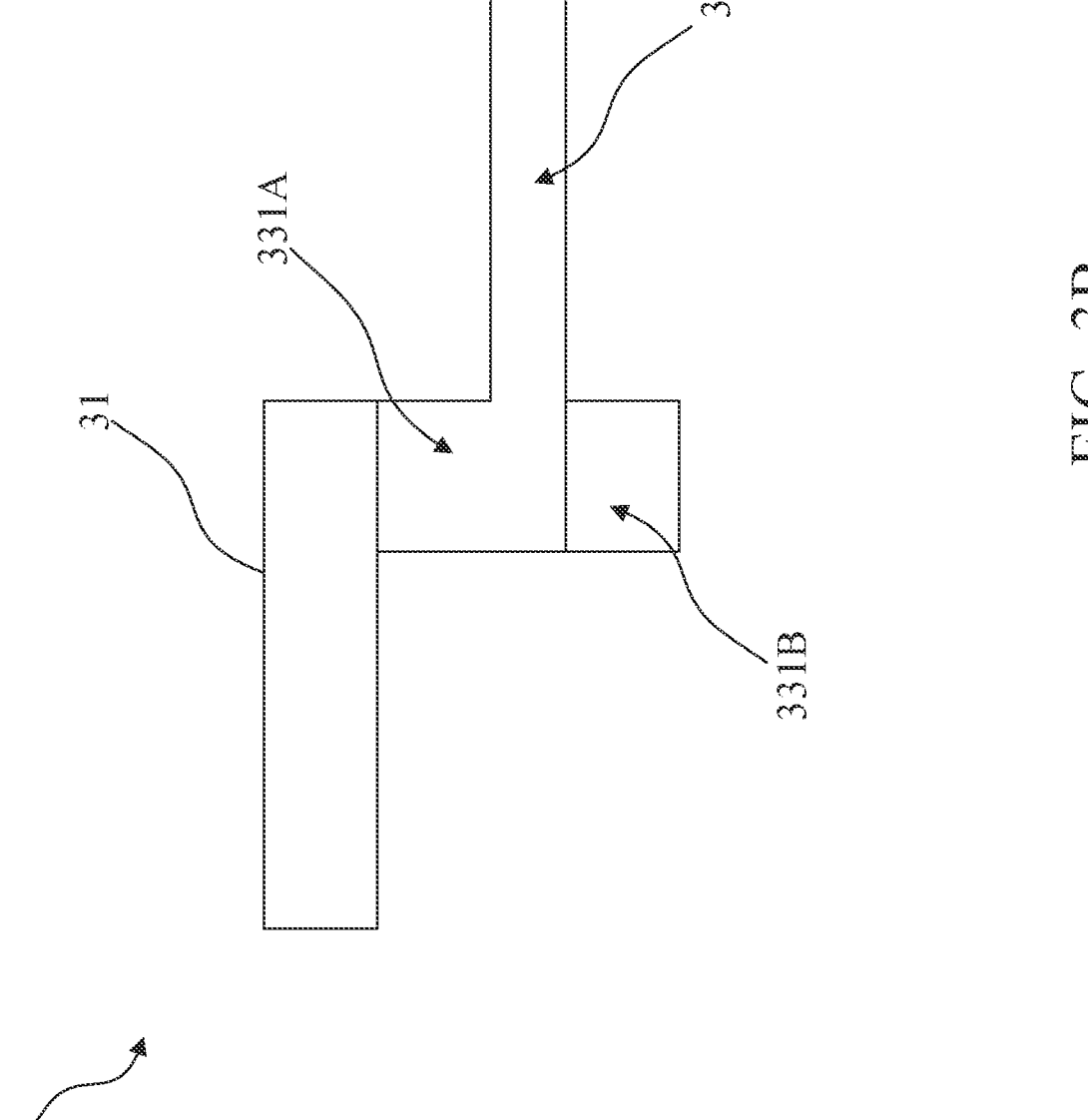
Figure 3C:
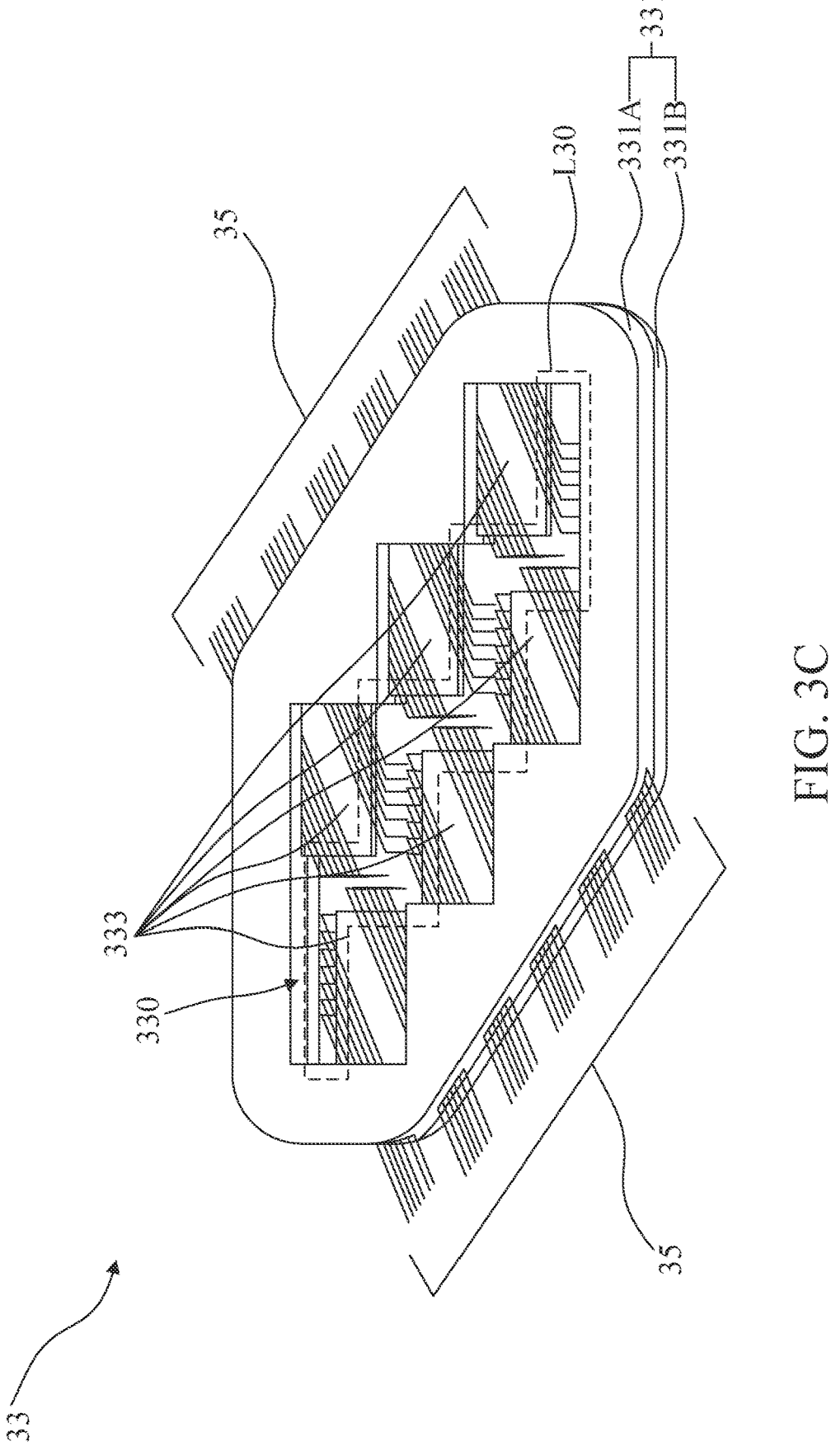
FIG. 3C and FIG. 3D are schematic views of a supporting structure carrying cantilever probes according to some embodiments of the disclosure.
Figure 3D:
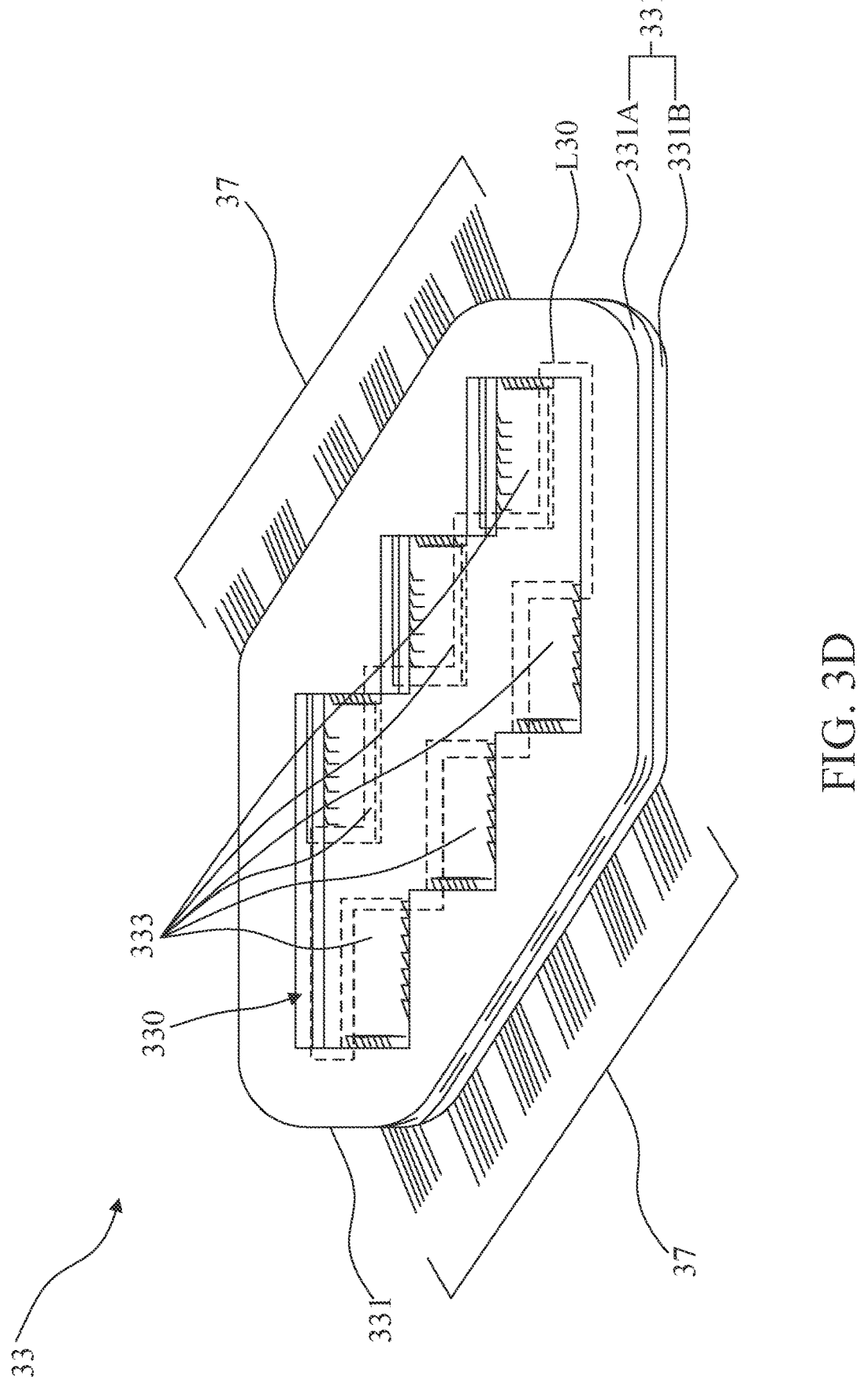
Figure 3E:
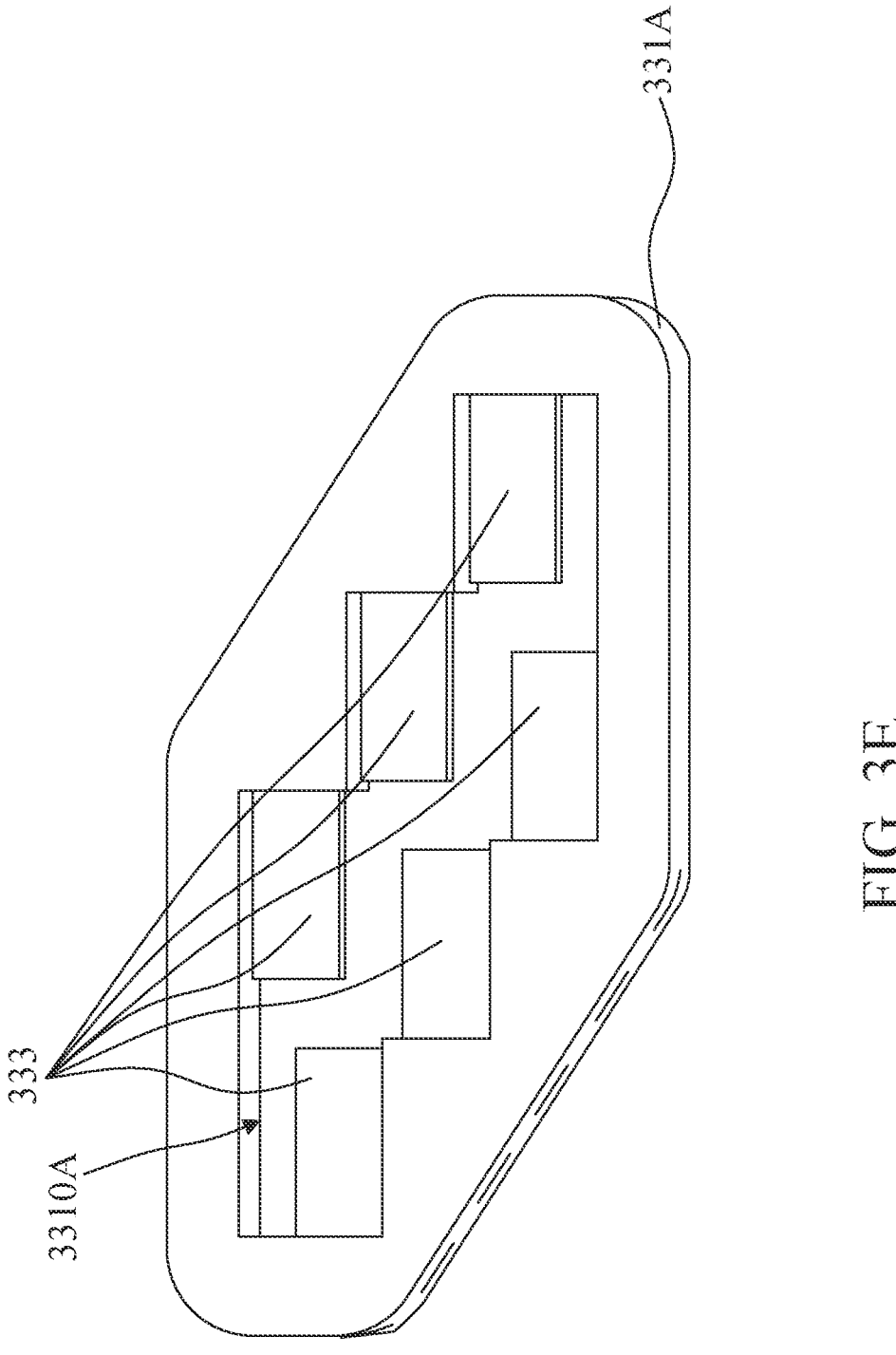
FIG. 3E and FIG. 3F are schematic views of different layers of a supporting structure according to some embodiments of the disclosure.
Figure 3F:
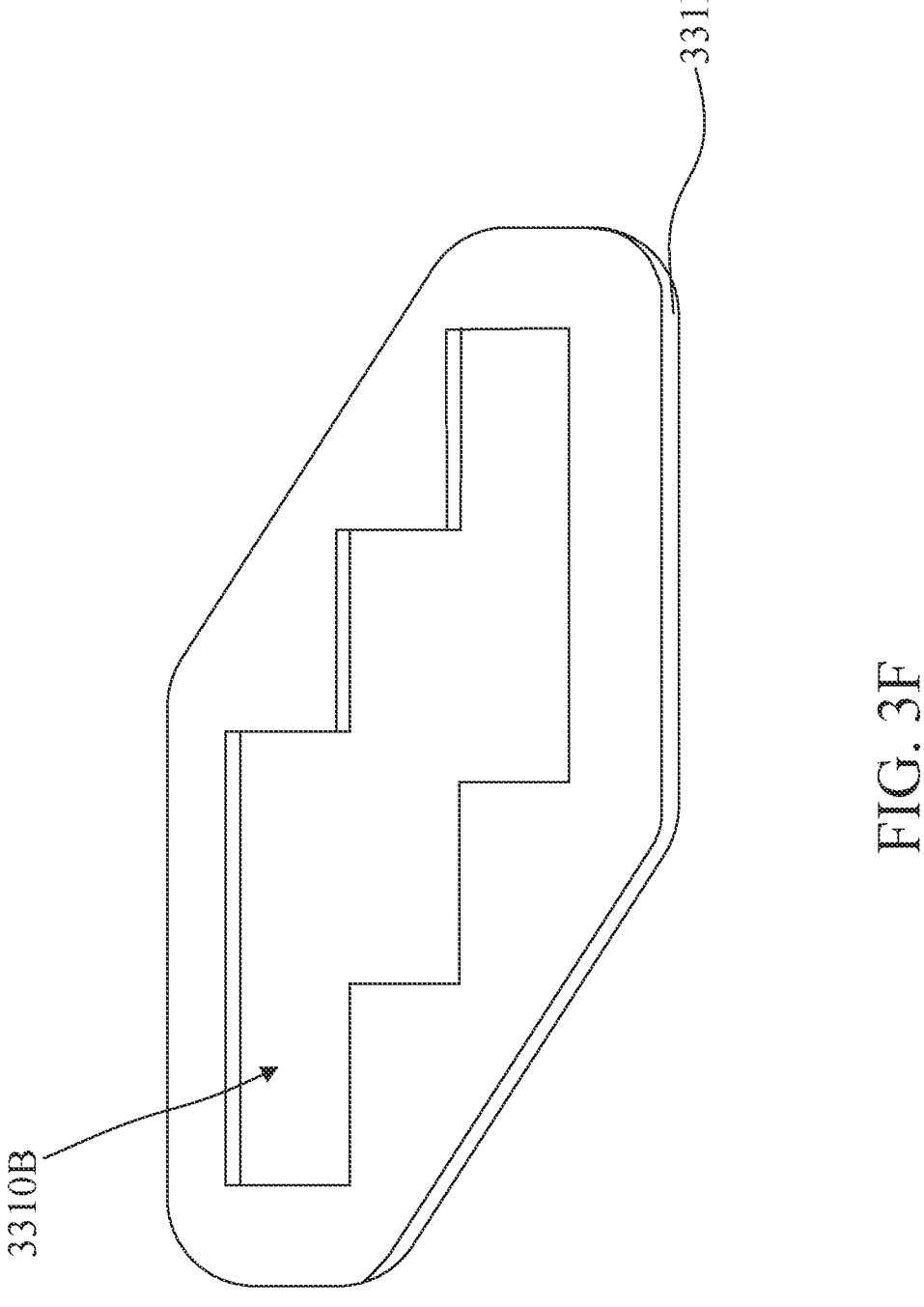

Refer to FIG. 3A through FIG. 3F. FIG. 3A and FIG. 3B are schematic views illustrative of the positions of elements of a probe card 3 relative to each other according to some embodiments of the disclosure. The probe card 3 includes a substrate 31, a supporting structure 33 and a probe structure 39. The probe structure 39 includes a plurality of first cantilever probes 35 and a plurality of second cantilever probes 37. FIG. 3C and FIG. 3D are schematic views of the supporting structure 33 carrying the first cantilever probes 35 and the second cantilever probes 37 according to some embodiments of the disclosure. For exemplary purposes, FIG. 3C shows how to carry the first cantilever probes 35, and FIG. 3D shows how to carry the second cantilever probes 37. As shown in the diagrams, the supporting device 33 actually carries the first cantilever probes 35 and the second cantilever probes 37 simultaneously. FIG. 3E and FIG. 3F are schematic views of a first layer 331A and a second layer 331B of a body 331 of the supporting structure 33 according to some embodiments of the disclosure, respectively.

In some embodiments, the supporting structure 33 is disposed on the substrate 31 and includes a body 331 and a plurality of protrusion portions 333. The body 331 includes a first layer 331A and a second layer 331B. The first layer 331A has a first opening 3310A. The second layer 331B has a second opening 3310B. The first opening 3310A and the second opening 3310B together form a main opening 330. The protrusion portions 333 are formed in the first layer 331A and protrude toward the inside of the main opening 330, allowing a stepped channel L30 (demarcated by the dashed line in FIG. 3C) to be formed in the main opening 330. One end of each of the first cantilever probes 35 is electrically connected to the substrate 31 and disposed on the first layer 331A along a surface (facing the substrate 31) of a corresponding one of the protrusion portions 333. The other end of the first cantilever probe 35 protrudes from an edge of the surface of the protrusion portion 333 and hangs within the stepped channel L30. Thus, the protrusion portions 333 support the first cantilever probes 35, and the first cantilever probes 35 pass through the stepped channel L30 to come into contact with a DUT zone (not shown). One end of each of the second cantilever probes 37 is electrically connected to the substrate 31 and disposed on the second layer 331B along a surface (facing the DUT) of the second layer 331B of the body 331. The other end of the second cantilever probe 37 protrudes from an edge of the surface of the second layer 331B of the body 331 and hangs to come into contact with the DUT zone.

In some embodiments, as shown in the diagrams, the body 331 is slotted or perforated to receive the first cantilever probes 35; thus, the first cantilever probes 35 can be configured to pass through the slot or hole of the body 331 and then lie along the surfaces of the protrusion portions 333.

Figure 3G:
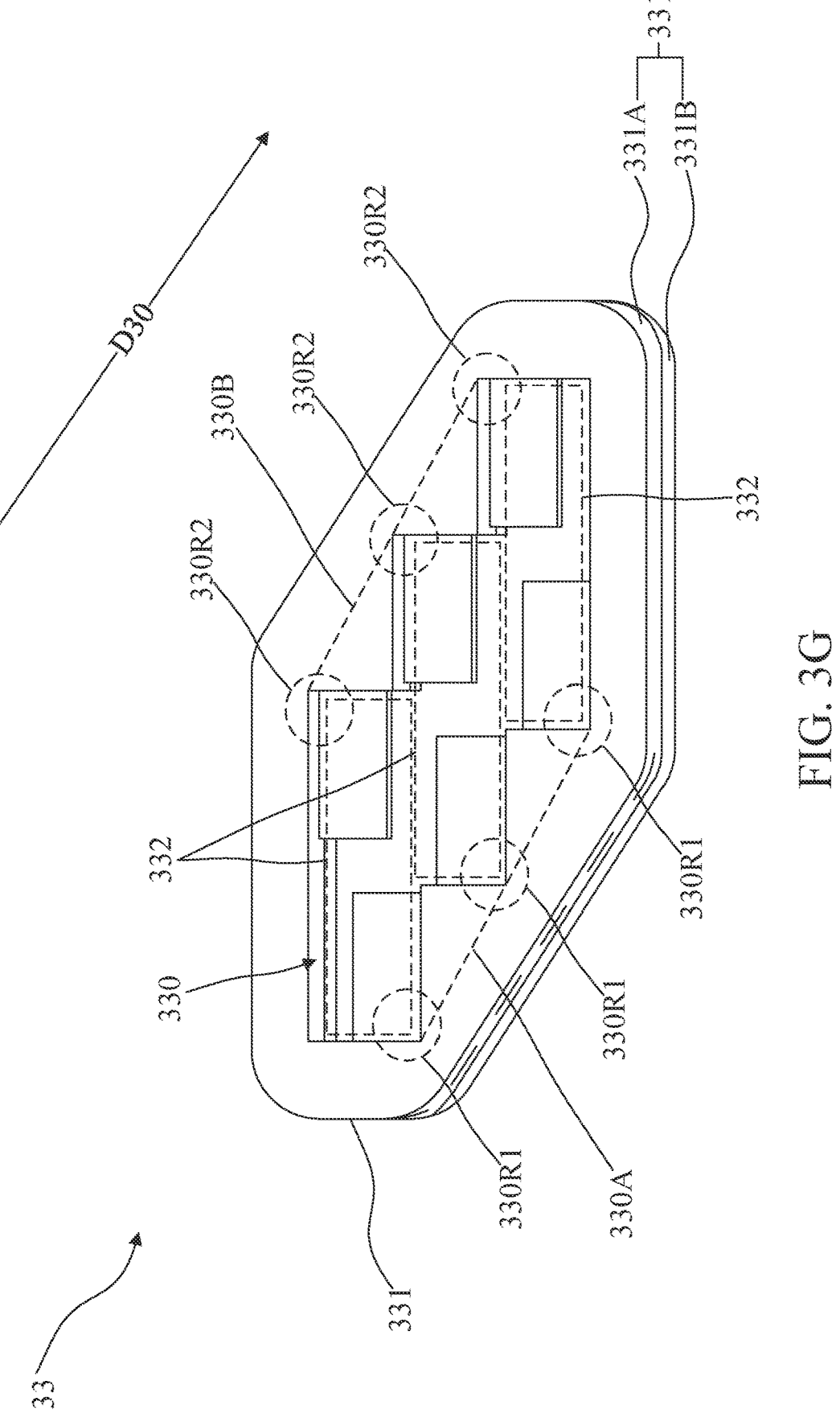
FIG. 3G is a schematic view of a supporting structure according to some embodiments of the disclosure.
Figure 3H:
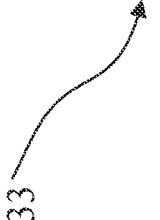
FIG. 3H is a top view of a supporting structure according to some embodiments of the disclosure.

Refer to FIG. 3G and FIG. 3H. FIG. 3G is a schematic view of the supporting structure 33 according to some embodiments of the disclosure. FIG. 3H is a top view of the supporting structure 33 according to some embodiments of the disclosure. The main opening 330 substantially extends in direction D30 to become elongated. Two long sides 330A and 330B of the main opening 330 each take on a stepped shape facing inward, forming the stepped channel L30 which extends in a lengthwise direction of the main opening 330. The stepped shape of the long side 330A has multiple dents 330R1. The stepped shape of the long side 330B has multiple dents 330R2. Each dent 330R1 and a corresponding one of the dents 330R2 define an elongated zone 332. The multiple elongated zones 332 defined by the multiple dents 330R1 and the multiple dents 330R2 are staggered in the main opening 330.

Thus, on the long side 330A, the first layer 331A is in a stepped shape in the first opening, and the second layer 331B is in a stepped shape in the second opening, allowing the stepped shape of the second layer 331B in the second opening and the stepped shape of the first layer 331A in the first opening to be identical in shape and correspond to each other in position. On the long side 330B, the first layer 331A is in a stepped shape in the first opening, and the second layer 331B is in a stepped shape in the second opening, allowing the stepped shape of the second layer 331B in the second opening and the stepped shape of the first layer 331A in the first opening to be identical in shape and correspond to each other in position. The stepped shapes of the first layer 331A and the second layer 331B on the long side 330A have multiple dents 330R1 which are identical in shape and correspond to each other in position. The stepped shapes of the first layer 331A and the second layer 331B on the long side 330B have multiple dents 330R2 which are identical in shape and correspond to each other in position.

The protrusion portions 333 protrude from the dents 330R1 and 330R2 toward the main opening 330. Thus, in each elongated zone 332, the protrusion portions 333 protrude diagonally and each form a supporting block S30 of the supporting structure 33 together with the body 331, and the free ends (not shown in FIG. 3E and FIG. 3F) of the cantilever probes 35 and 37 supported by each supporting block S30 are for use in testing a DUT zone. Since each elongated zone 332 has therein two supporting blocks S30, the two supporting blocks S30 of each elongated zone 332 can test two DUT zones.

Since the elongated zones 332 in the main opening 330 are staggered, the cantilever probes 35 and 37 (not shown in FIG. 3E and FIG. 3F) supported by the supporting blocks S30 can be configured to use the free ends to test multiple rows of DUTs arranged obliquely (for example, obliquely-arranged supporting blocks S30-1, S30-3, S30-5 and obliquely-arranged supporting blocks S30-2, S30-4, S30-6).

Figure 4A:
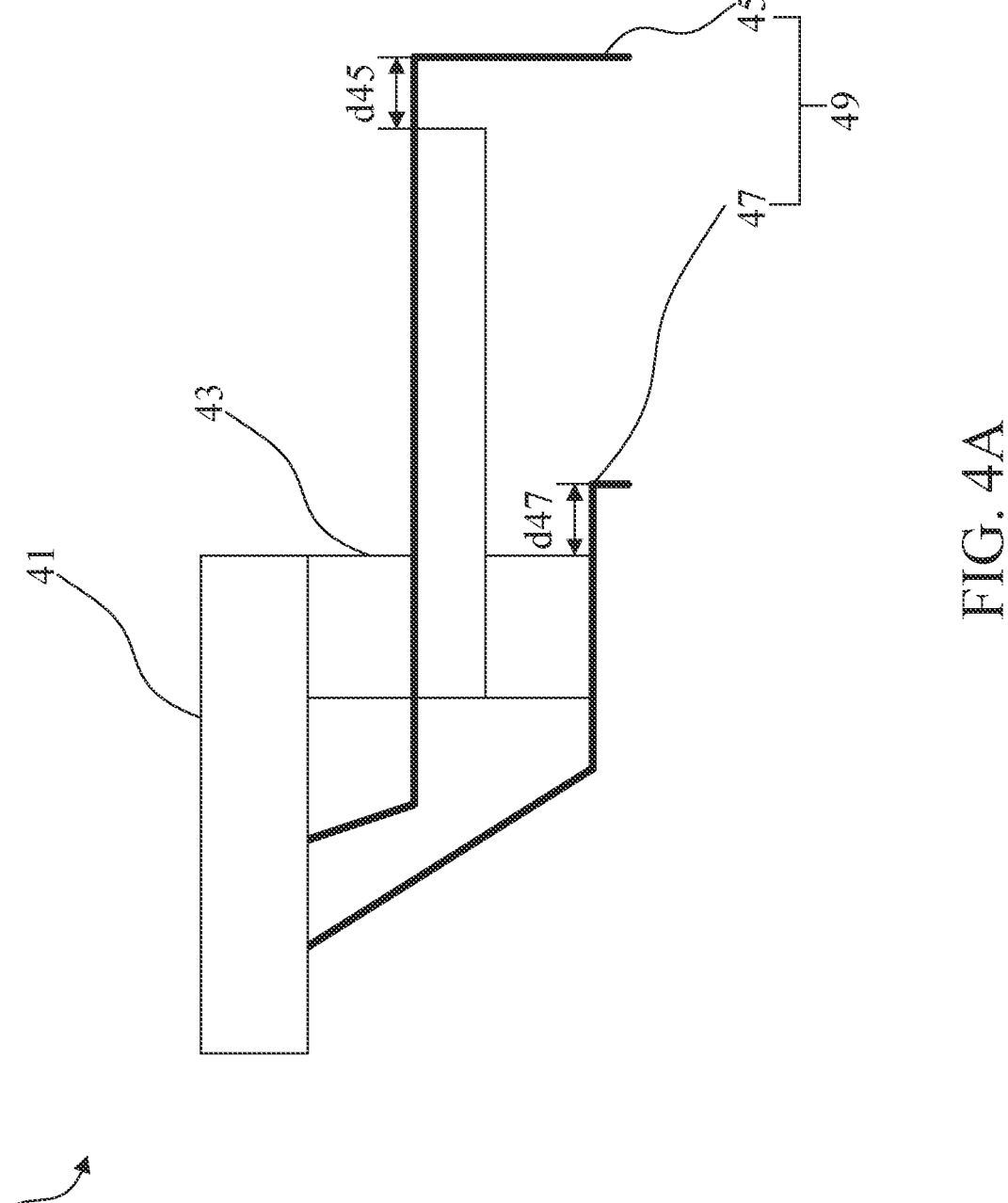
FIG. 4A and FIG. 4B are schematic views illustrative of the positions of elements of a probe card relative to each other according to some embodiments of the disclosure.
Figure 4B:
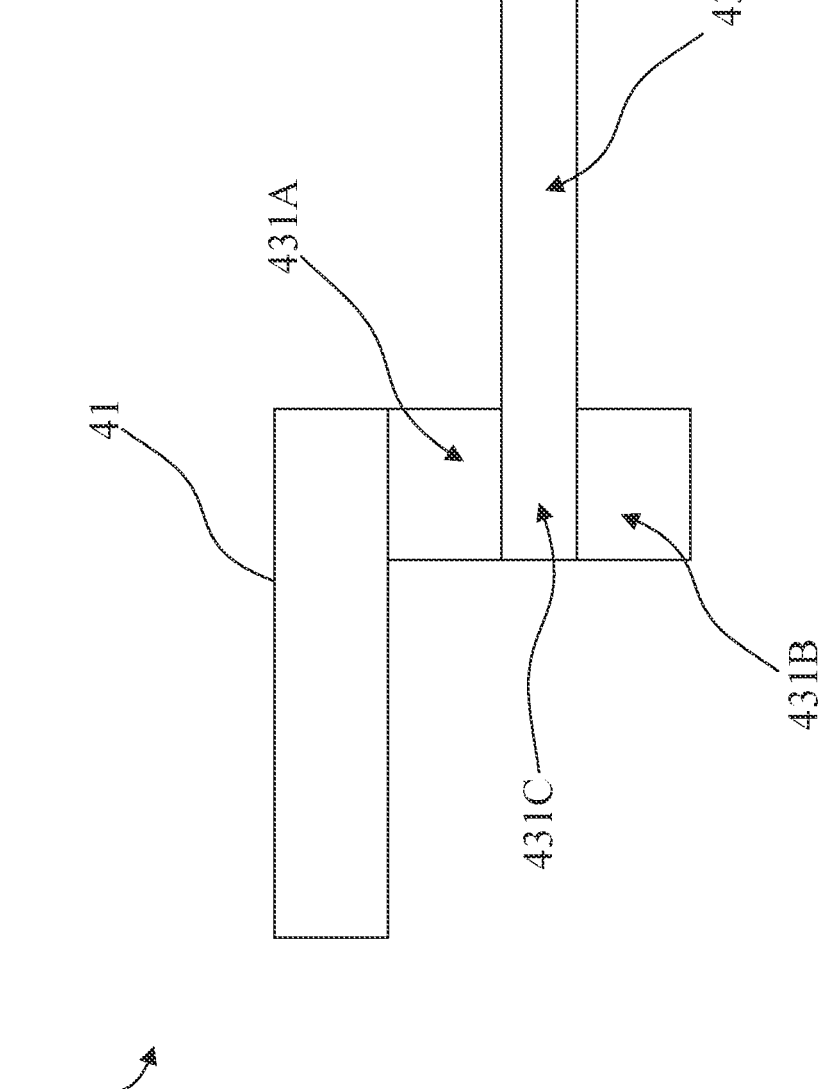
Figure 4C:
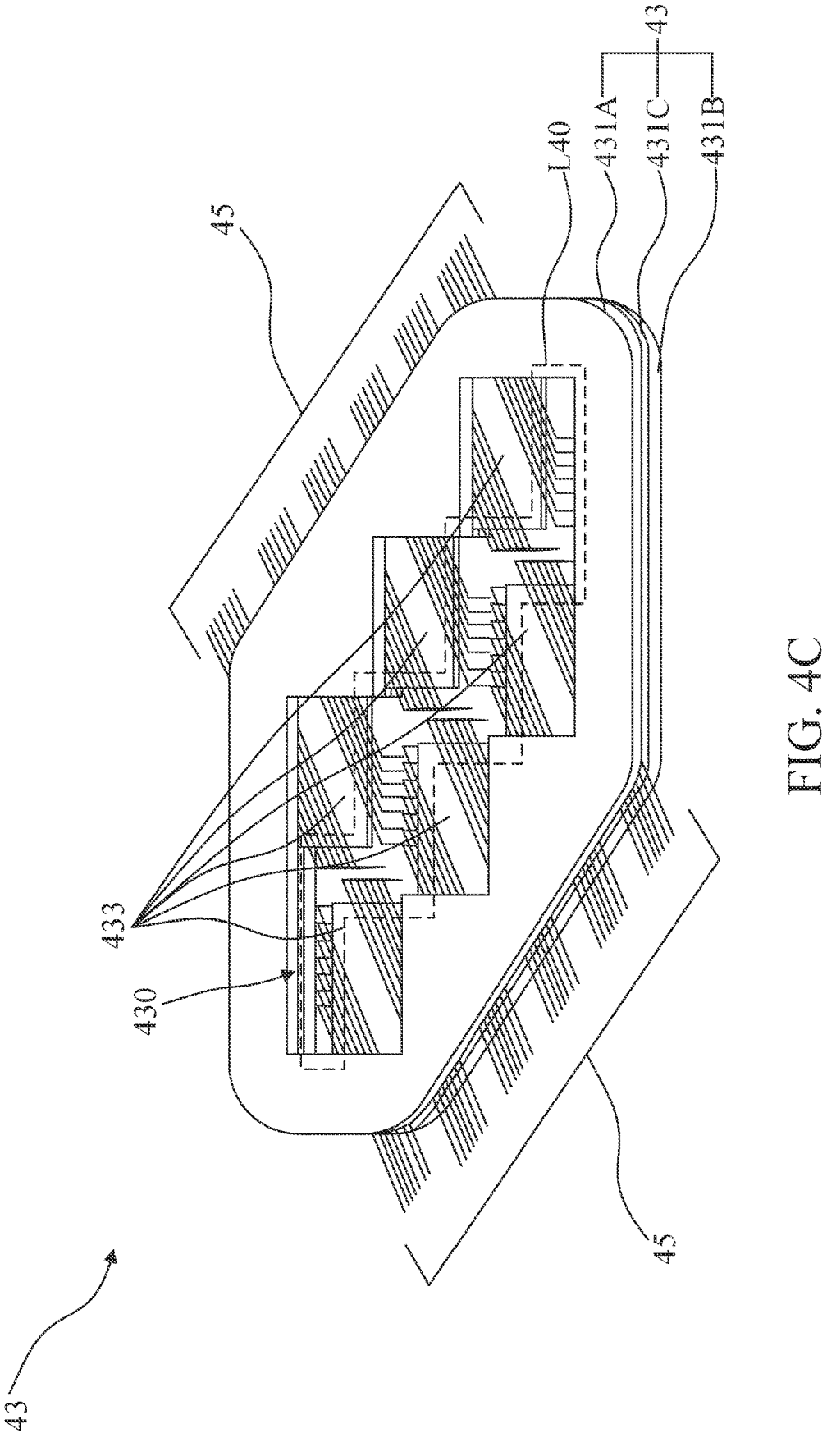
FIG. 4C and FIG. 4D are schematic views of a supporting structure carrying cantilever probes according to some embodiments of the disclosure.
Figure 4D:
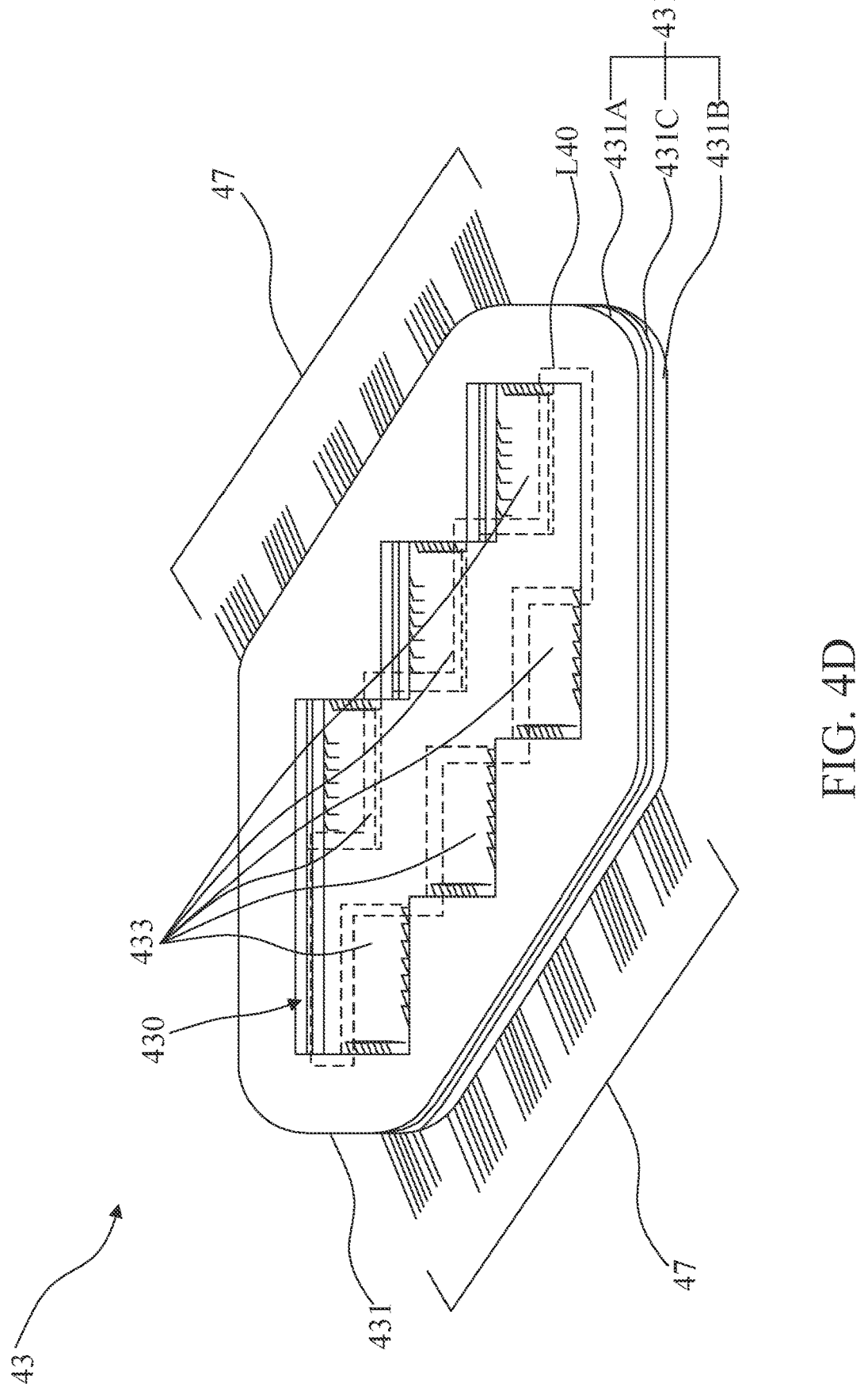
Figure 4E:
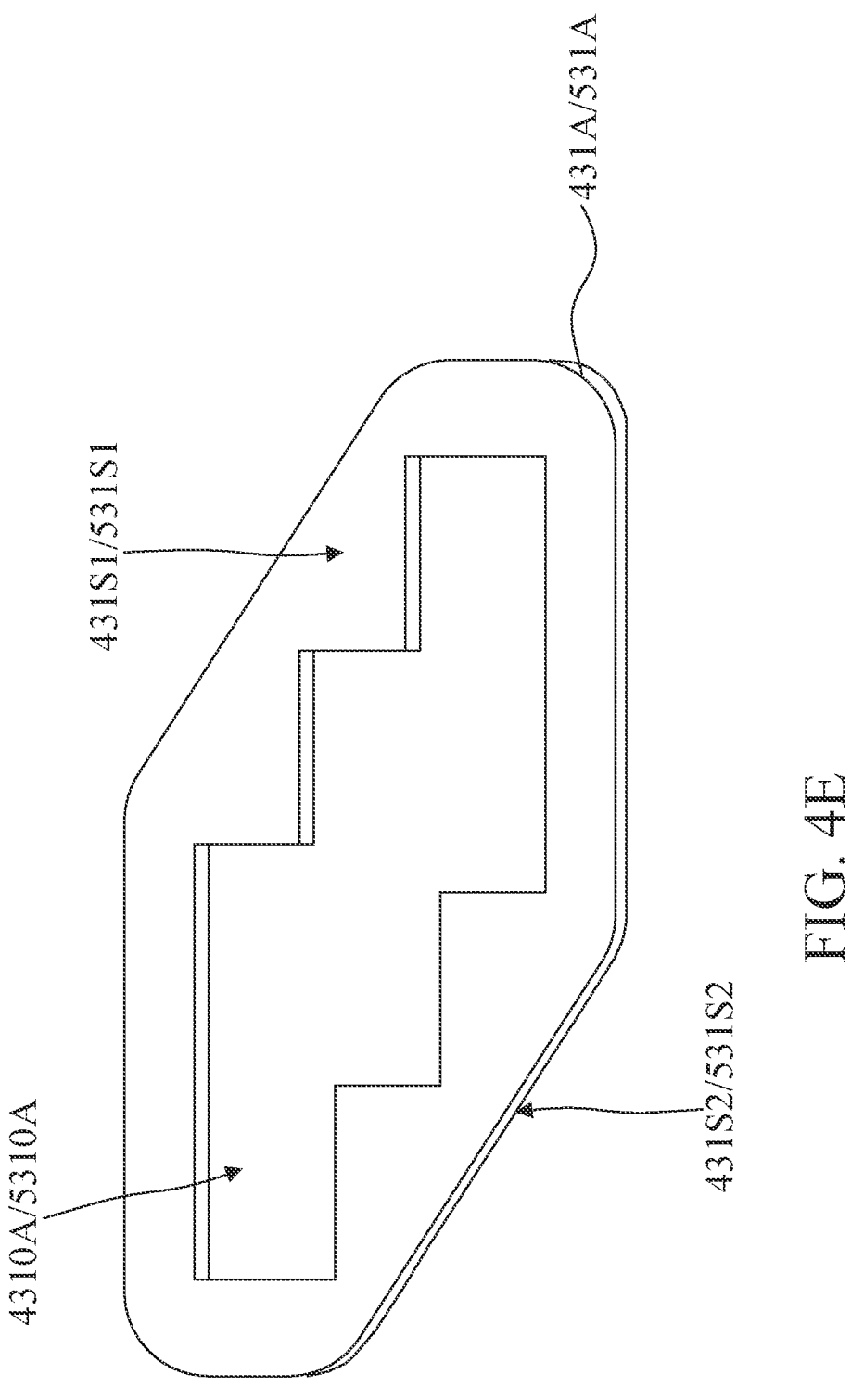
FIG. 4E through FIG. 4G are schematic views of different layers of a supporting structure according to some embodiments of the disclosure.
Figure 4F:
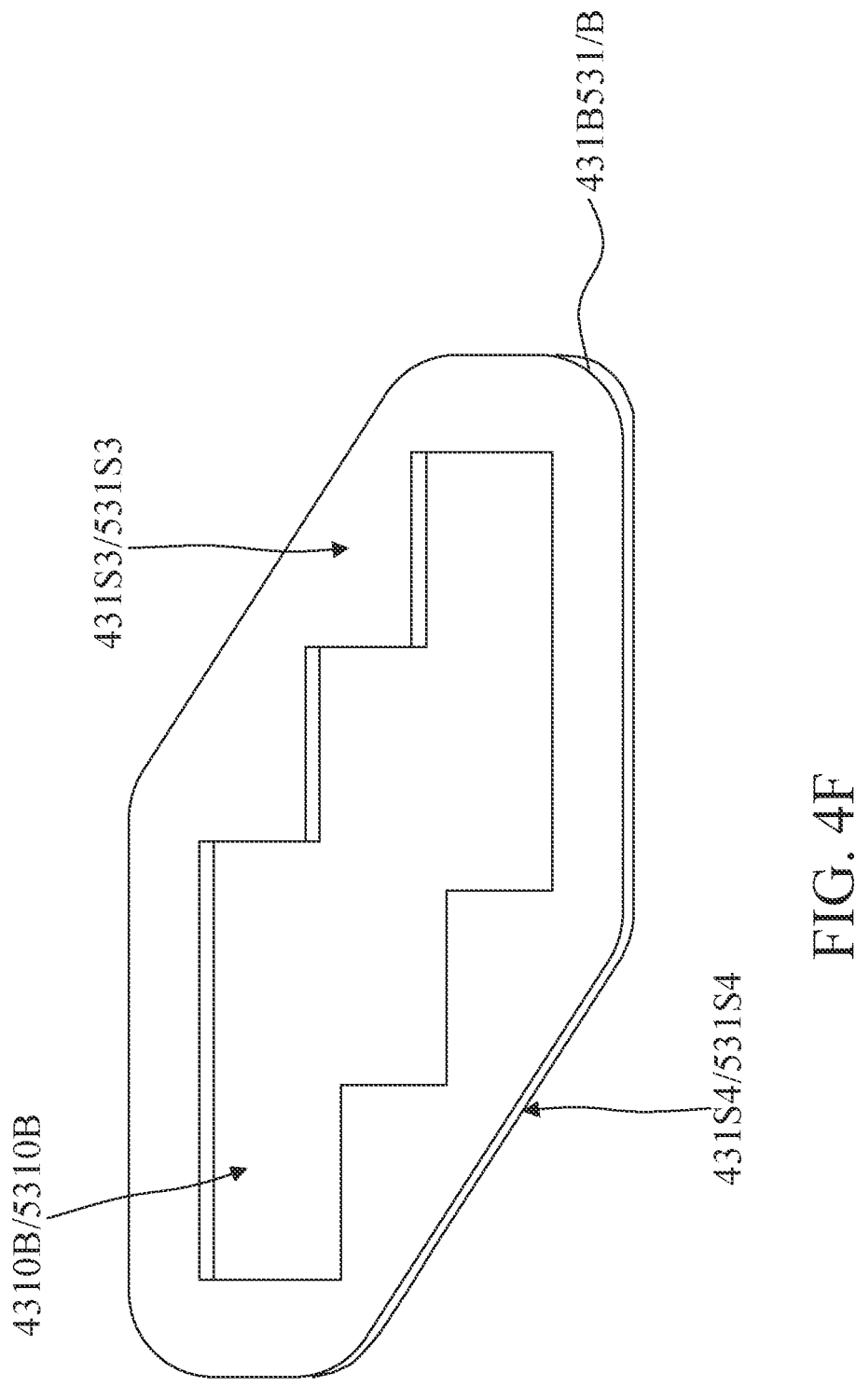
Figure 4G:
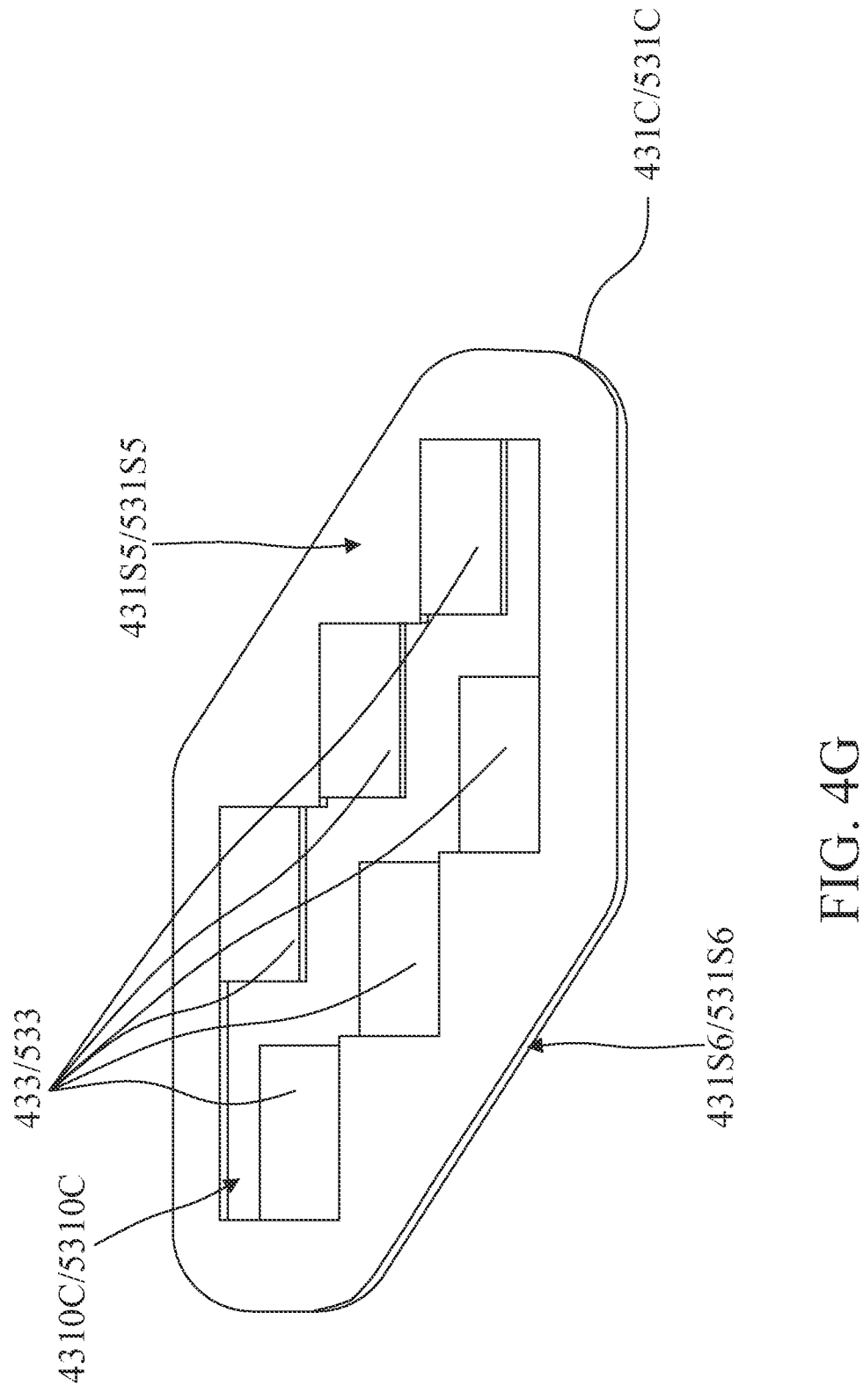

Refer to FIG. 4A through FIG. 4G. FIG. 4A and FIG. 4B are schematic views illustrative of the positions of elements of a probe card 4 relative to each other according to some embodiments of the disclosure. The probe card 4 includes a substrate 41, a supporting structure 43 and a probe structure 49. The probe structure 49 includes a plurality of first cantilever probes 45 and a plurality of second cantilever probes 47. FIG. 4C and FIG. 4D are schematic views of the supporting structure 43 carrying first cantilever probes 45 and the second cantilever probes 47 according to some embodiments of the disclosure. For exemplary purposes, FIG. 4C shows how to carry the first cantilever probes 45, and FIG. 4D shows how to carry the second cantilever probes 47. As shown in the diagrams, the supporting device 43 actually carries the first cantilever probes 45 and the second cantilever probes 47 simultaneously. FIG. 4E, FIG. 4F and FIG. 4G are schematic views of a first layer 431A, a second layer 431B and an intermediate layer 431C of a body of the supporting structure 43 according to some embodiments of the disclosure, respectively.

In some embodiments, the supporting structure 43 is disposed on the substrate 41 and includes a body 431. The body 431 includes the first layer 431A, second layer 431B and intermediate layer 431C. The first layer 431A has a first surface 431S1, a second surface 431S2 and a first opening 4310A. The second layer 431B has a first surface 431S3, a second surface 431S3 and a second opening 4310B. The first surface 431S1 and the second surface 431S2 of the first layer 431A adjoin the substrate 41 and a first surface 431S5 of the intermediate layer 431C, respectively. The first surface 431S3 of the second layer 431B adjoins a second surface 431S6 of the intermediate layer 431C. The first opening 4310A and the second opening 4310B together form a main opening 430. The intermediate layer 431C is disposed between the first layer 431A and the second layer 431B. A plurality of protrusion portions 433 are formed on the intermediate layer 431C and protrude toward the inside of the main opening 430, allowing a stepped channel L40 (demarcated by the dashed line in FIG. 4C) to be formed in the main opening 430.

Figure 4H:
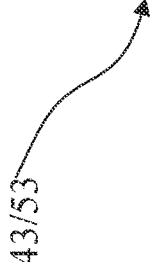
FIG. 4H is a top view of a supporting structure according to some embodiments of the disclosure.

Referring to FIG. 4H, there is shown a top view of the supporting structure 43 according to some embodiments of the disclosure. The protrusion portions 433 define multiple channels C41~C47 in the main opening 430. In some embodiments, one end of each channel connects to one end of another channel. In some embodiments, the channels C41~C47 form a stepped channel L40. In some embodiments, the directions of extension of two channels connected to each other differ. In some embodiments, the lengthwise extension directions of two channels connected to each other are not parallel. For example, the lengthwise extension directions of channel C41 and channel C42 are not parallel, whereas the lengthwise extension directions of channel C42 and channel C43 are not parallel. In some embodiments, the lengthwise extension directions of channels not connected to each other are parallel. For example, the lengthwise extension directions of channel C41 and channel C43 are parallel, whereas the lengthwise extension directions of channel C42 and channel C44 are parallel.

In some embodiments, the first cantilever probes 45 each have one end electrically connected to the substrate 41 and disposed between the second surface 431S2 of the first layer 431A and the first surface 431S5 of the intermediate layer 431C and along a surface (facing the substrate 31) of a corresponding one of the protrusion portions 433. The other end of each first cantilever probe 45 protrudes and hangs from the edge of the surface of the protrusion portion 433 and hangs within the stepped channel L40. The first cantilever probes 45 protrude and hang from the protrusion portion 433 by the same length d45. Thus, protrusion portions 433 support the first cantilever probes 45. The first cantilever probes 45 pass through the stepped channel L40 to come into contact with a DUT zone (not shown). The second cantilever probes 47 each have one end electrically connected to the substrate 41 and are disposed along a second surface 431S4 (a surface facing a DUT) of the second layer 431B of the body 431 and on the second surface of the second layer 431B. The other end of the second cantilever probe 47 protrudes and hangs from the edge of the second surface of the second layer 431B to come into contact with a DUT zone. The second cantilever probes 47 protrude and hang from the second layer 431B by the same length d47. In some embodiments, the lengths d45 and d47 are equal. In some embodiments, the lengths d45 and d47 are different.

Figure 4I:
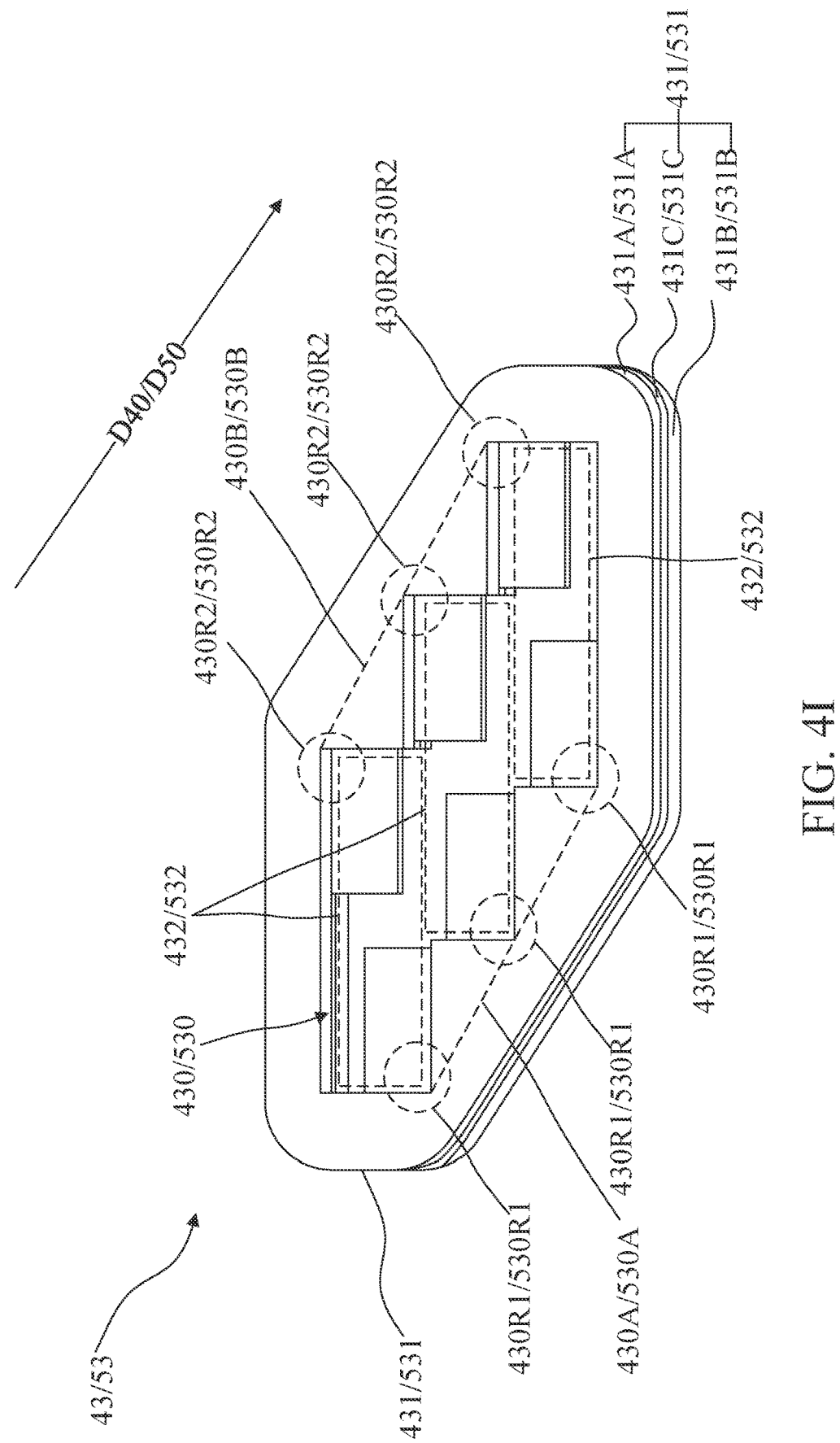
FIG. 4I is a schematic view of a supporting structure according to some embodiments of the disclosure.
Figure 4J:
FIG. 4J is a top view of a supporting structure according to some embodiments of the disclosure.

Refer to FIG. 4I and FIG. 4J. FIG. 4I is a schematic view of the supporting structure 43 according to some embodiments of the disclosure. FIG. 4J is another top view of the supporting structure 43 according to some embodiments of the disclosure. The main opening 430 substantially extends in direction D40 to become elongated. Two long sides 430A and 430B of the main opening 430 each take on a stepped shape facing inward. The stepped shape of the long side 430A has multiple dents 430R1. The stepped shape of the long side 430B has multiple dents 430R2. Each dent 430R1 and a corresponding one of the dents 430R2 define an elongated zone 432. The multiple elongated zones 432 defined by the multiple dents 430R1 and the multiple dents 430R2 are staggered in the main opening 430.

Thus, on the long side 430A, the first layer 431A is in a stepped shape in the first opening, and the second layer 431B is in a stepped shape in the second opening, allowing the stepped shape of the second layer 431B in the second opening and the stepped shape of the first layer 431A in the first opening to be identical in shape and correspond to each other in position. On the long side 430B, the first layer 431A is in a stepped shape in the first opening, and the second layer 431B is in a stepped shape in the second opening, allowing the stepped shape of the second layer 431B in the second opening and the stepped shape of the first layer 431A in the first opening to be identical in shape and correspond to each other in position. The stepped shapes of the first layer 431A and the second layer 431B on the long side 430A have multiple dents 430R1 which are identical in shape and correspond to each other in position. The stepped shapes of the first layer 431A and the second layer 431B on the long side 430B have multiple dents 430R2 which are identical in shape and correspond to each other in position.

The protrusion portions 433 protrude from the dents 430R1 and 430R2 toward the main opening 430. Thus, in each elongated zone 432, the protrusion portions 433 protrude diagonally and each form a supporting block S40 of the supporting structure 43 together with the body 431, and the free ends (not shown in FIG. 4I and FIG. 4J) of the cantilever probes 45 and 47 supported by each supporting block S40 are for use in testing a DUT zone. Since each elongated zone 432 has therein two supporting blocks S40, the two supporting blocks S40 of each elongated zone 432 can test two DUT zones.

Since the elongated zones 432 in the main opening 430 are staggered, the cantilever probes 45 and 47 (not shown in FIG. 4I and FIG. 4J) supported by the supporting blocks S40 can be configured to use the free ends to test multiple rows of DUTs arranged obliquely (for example, obliquely-arranged supporting blocks S40-1, S40-3, S40-5 and obliquely-arranged supporting blocks S40-2, S40-4, S40-6).

Figure 4K:
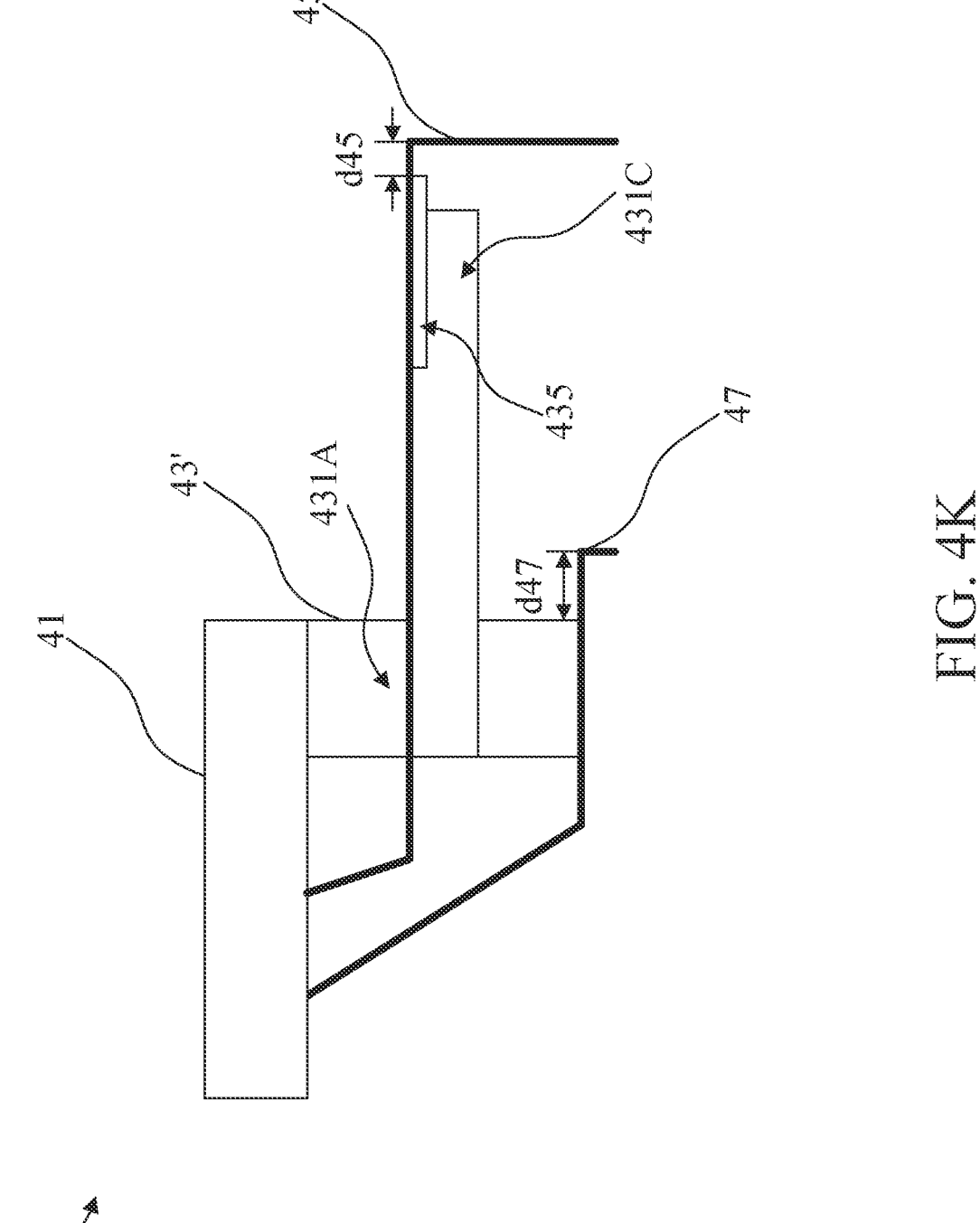
FIG. 4K is a schematic view illustrative of the positions of elements of a probe card relative to each other according to some embodiments of the disclosure.

Referring to FIG. 4K, there is shown a schematic view illustrative of the positions of elements of a probe card 4' relative to each other according to some embodiments of the disclosure. The probe card 4' is distinguished from the probe card 4 in that the supporting structure 43' of the probe card 4' further includes a probe adjustment component 435 disposed between the first layer 431A and the intermediate layer 431C. Therefore, the length d45 by which the first cantilever probes 45 protrude and hang from the edge of the intermediate layer 431C can be controlled by adjusting the position of the probe adjustment component 435.

Figure 5A:
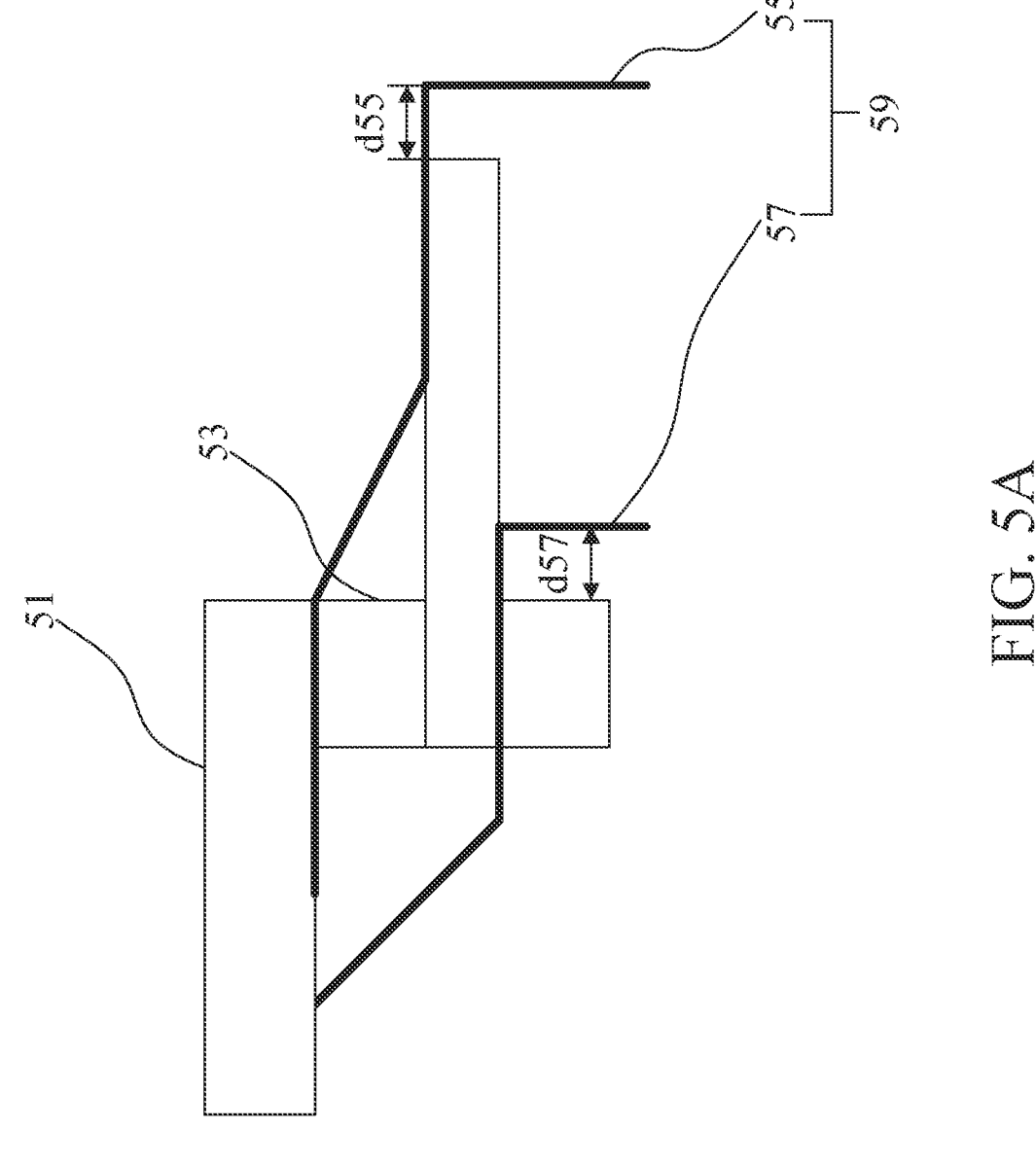
FIG. 5A and FIG. 5B are schematic views illustrative of the positions of elements of a probe card relative to each other according to some embodiments of the disclosure.
Figure 5B:
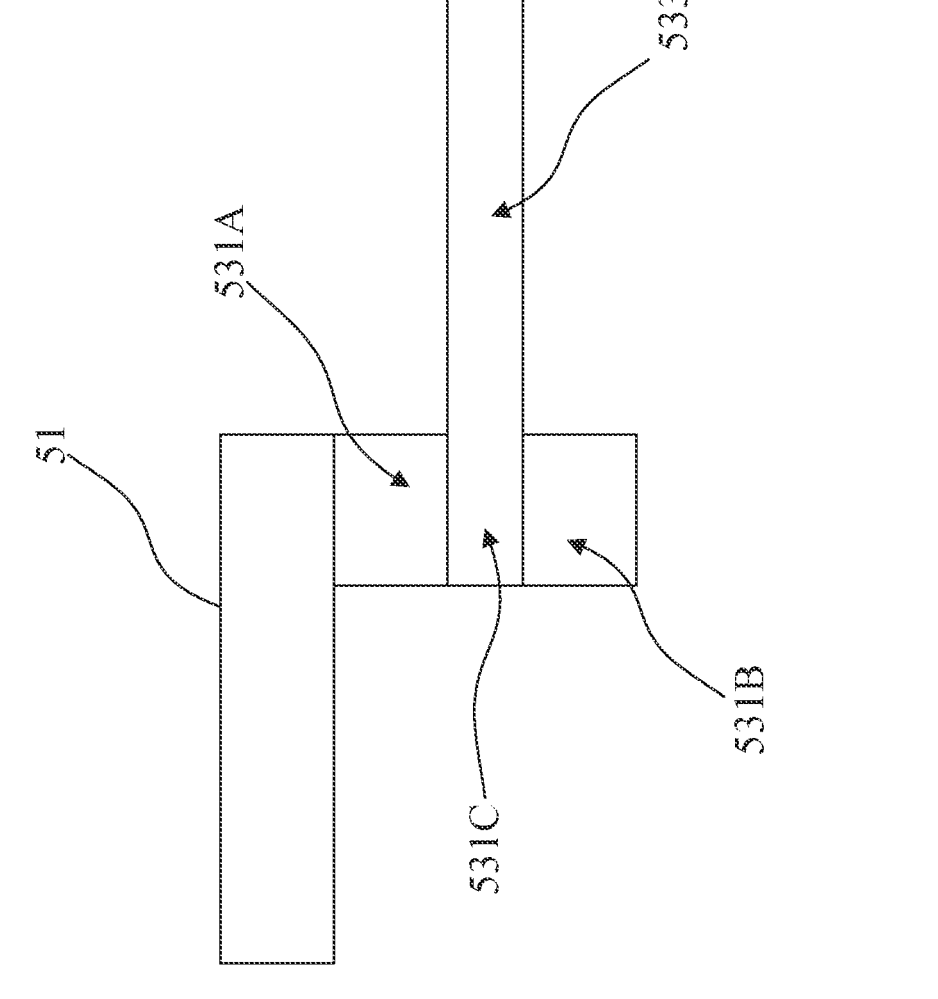
Figure 5C:
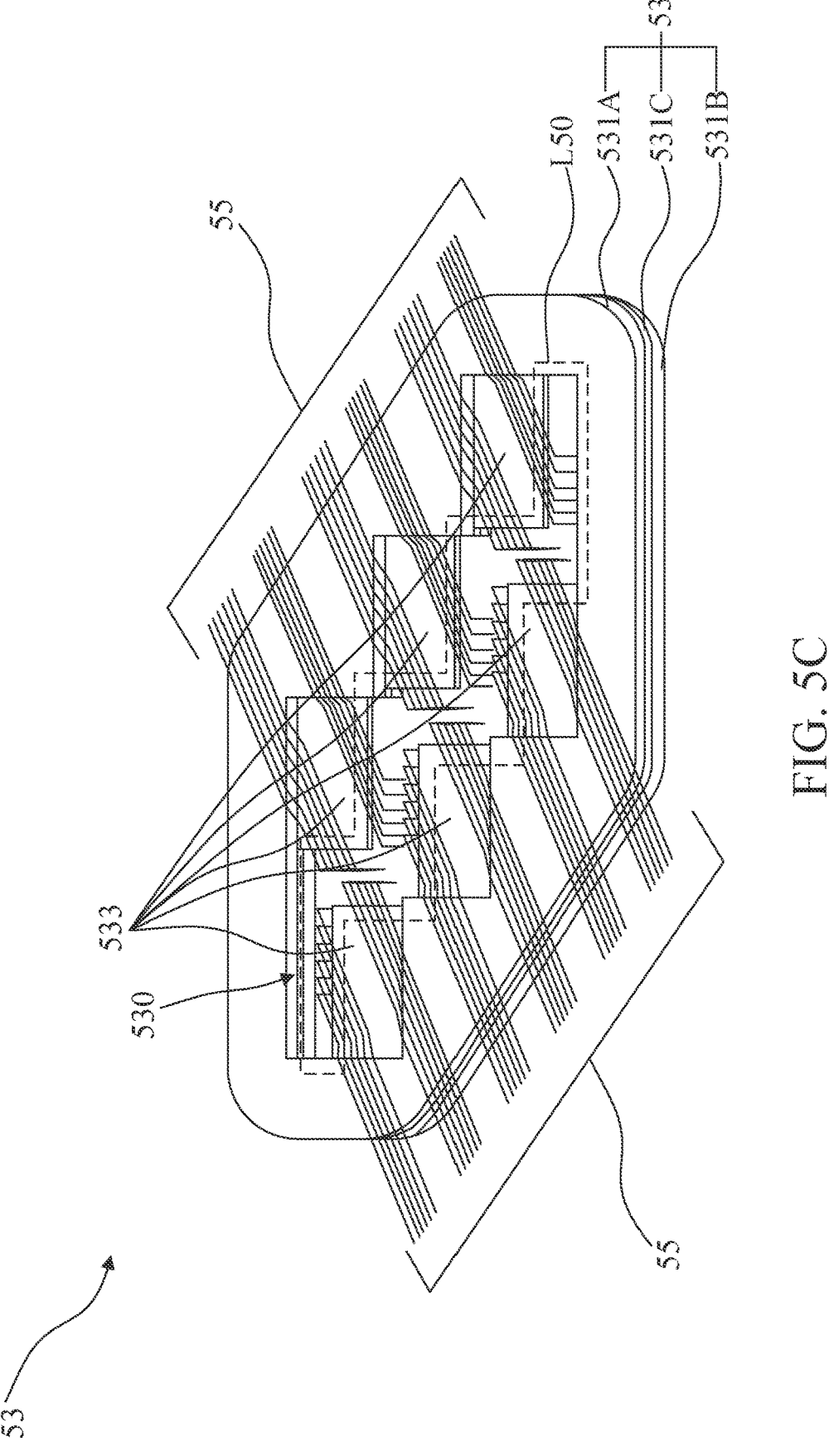
FIG. 5C and FIG. 5D are schematic views of a supporting structure carrying cantilever probes according to some embodiments of the disclosure.
Figure 5D:
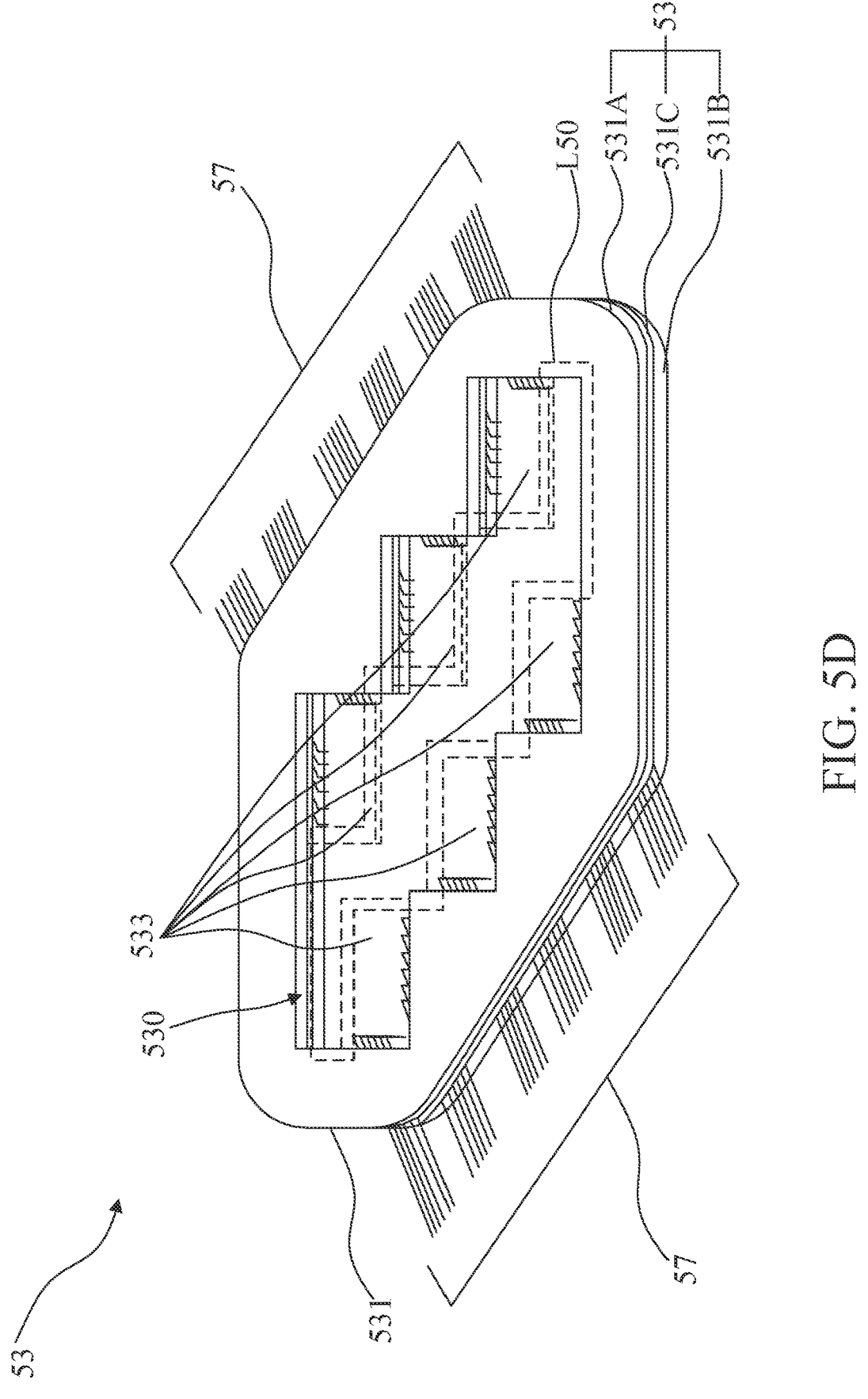

Refer to FIG. 5A through FIG. 5D. FIG. 5A and FIG. 5B are schematic views illustrative of the positions of elements of a probe card 5 relative to each other according to some embodiments of the disclosure. The probe card 5 includes a substrate 51, a supporting structure 53 and a probe structure 59. The probe structure 59 includes a plurality of first cantilever probes 55 and a plurality of second cantilever probes 57. FIG. 5C and FIG. 5D are schematic views of the supporting structure 53 carrying the first cantilever probes 55 and the second cantilever probes 57 according to some embodiments of the disclosure. For exemplary purposes, FIG. 5C shows how to carry the first cantilever probes 55, and FIG. 5D shows how to carry the second cantilever probes 57. As shown in the diagrams, the supporting device 53 actually carries the first cantilever probes 55 and the second cantilever probes 57 simultaneously. It is noteworthy that the technical features of a first layer 531A, a second layer 531B and an intermediate layer 531C of a body of the supporting structure 53 according to some embodiments of the disclosure are identical to the technical features of the first layer 431A, second layer 431B and intermediate layer 431C in FIGS. 4E, 4F, 4G.

In some embodiments, the supporting structure 53 is disposed on the substrate 51 and includes a body 531. The body 531 includes a first layer 531A, a second layer 531B and an intermediate layer 531C. The first layer 531A has a first surface 531S1, a second surface 531S2 and a first opening 5310A. The second layer 531B has a first surface 531S3, a second surface 531S3 and a second opening 5310B. The first surface 531S1 and the second surface 531S2 of the first layer 531A adjoin the substrate 51 and a first surface 531S5 of the intermediate layer 531C, respectively. The first surface 531S3 of the second layer 531B adjoins a second surface 531S6 of the intermediate layer 531C. The first opening 5310A and the second opening 5310B together form a main opening 530. The intermediate layer 531C is disposed between the first layer 531A and the second layer 531B. A plurality of protrusion portions 533 are formed on the intermediate layer 531C and protrude toward the inside of the main opening 530, allowing a stepped channel L50 (demarcated by the dashed line in FIG. 5C) to be formed in the main opening 530.

Note that the arrangement of the first and second cantilever probes 55 and 57 of the probe card 5 is different from that of the probe card 4. In the probe card 4, the first cantilever probes 45 are disposed between the first layer 431A and the intermediate layer 431C, and the second cantilever probes 47 are disposed below the second layer 431B. In the probe card 5, the first cantilever probes 55 are disposed between the substrate 51 and the first layer 531A, and the second cantilever probes 57 are disposed between the intermediate layer 531C and the second layer 531B.

It is noteworthy that the top view of the supporting structure 53 is similar to the top view of the supporting structure 43 in FIG. 4H. The arrangement of channels C51~C57 of the supporting structure 53 is substantially the same as the arrangement of channels C41~C47 of the supporting structure 43.

In some embodiments, the first cantilever probes 55 each have one end electrically connected to the substrate 51, pass between the substrate 51 and the first layer 531A, and are aligned with the direction of the protrusion of the protrusion portions 533 of the intermediate layer 531C. The other ends of the first cantilever probes 55 protrude and hang from the edges of the protrusion portions 533, respectively, hanging in the stepped channel L50. The first cantilever probes 55 protrude and hang from the protrusion portions 533 by the same length d55. Thus, the protrusion portions 533 support the first cantilever probes 55. The first cantilever probes 55 pass through the stepped channel L50 to come into contact with a DUT zone (not shown). The second cantilever probes 57 not only each have one end electrically connected to the substrate 51 but also pass between the intermediate layer 531C and the second layer 531B and lie along the first surface 531S3 of the second layer 531B of the body 531. The other end of each second cantilever probe 57 protrudes and hangs from the edge of the first surface 531S3 of the second layer 531B to come into contact with the DUT zone. The second cantilever probes 57 protrude and hang from the second layer 531B by the same length d57. In some embodiments, the lengths d55 and d57 are equal. In some embodiments, the lengths d55 and d57 are different.

It is noteworthy that the supporting structure 53 in some embodiments of the disclosure is similar to the supporting structure 43 of FIG. 4I and FIG. 4J such that elements 530, 531, 532, 530A, 530B, 530R1, 530R2, 531A, 531B, 531C, D50, S50 of the supporting structure 53 are substantially identical to elements 430, 431, 432, 430A, 430B, 430R1, 430R2, 431A, 431B, 431C, D40, S40 of the supporting structure 43 in terms of arrangement.

In the above embodiments, each supporting zone can be a quadrilateral zone, allowing the first cantilever probes to be configured to hang from the protrusion portions in the vicinity of two adjacent sides, and the second cantilever probes to be configured to hang from the body toward the surface of the DUT in the vicinity of two other adjacent sides. The substrate includes a circuit board electrically connected to the cantilever probes and adapted to control and test the transmission of related signals. The intermediate layer is made of a supportive, insulating material, for example, polyester film. However, the material does not place any limitations on the shape of the protrusion portions, the shape of the supporting zones, and the implementation of the substrate and the intermediate layer.

In some embodiments, the edges of a plurality of protrusion portions (for example, the protrusion portions 133, 233, 333, 433, 533) are coated with an adhesive for fixing the first cantilever probes in place and preventing the first cantilever probes from being separated from the surfaces of the protrusion portions when lifted from a DUT. In some embodiments, when the second cantilever probes (for example, the second cantilever probes 17, 27, 37, 47) are disposed on one side of the supporting structure (for example, one side of the body 131, one side of the second layer 231B, one side of the second layer 331B, and one side of the second layer 431B), the side can be coated with an adhesive for fixing the second cantilever probes in place and preventing the second cantilever probes from separating from the supporting structure.

Furthermore, regarding the supporting structure in the aforesaid embodiments, the first cantilever probes can be configured to: (1) pass between a substrate and a supporting structure and lie over a plurality of protrusion portions; (2)

pass through the supporting structure and lie over the plurality of protrusion portions; or (3) pass through the supporting structure and lie under the plurality of protrusion portions, and the second cantilever probes can be configured to: (1) pass through the supporting structure and lie under the plurality of protrusion portions; or (2) lie under the supporting structure. The above description enables persons skilled in the art to understand various combinations and arrangements of probes conducive to achieving the objective of the disclosure.

To sum up, a probe card and a supporting structure thereof provided in embodiments of the disclosure each include protrusion portions for forming a stepped channel in a main opening to optimize the arrangements of cantilever probes with a view to testing multiple rows of obliquely-arranged DUT zones and preventing probe collisions.

Although the disclosure and advantages thereof are described above, persons skilled in the art understand that various changes, replacements and substitutions may be made to the disclosure without departing from the spirit and scope defined in the appended claims of the disclosure. For instance, the aforesaid processes may be implemented with different methods and replaced with any other processes or a combination thereof.

The scope of the disclosure is not restricted to specific embodiments of any processes, machines, manufacturing, matter compositions, means, methods and steps described herein. The disclosure described herein enables persons skilled in the art to implement the disclosure with any existing or potential processes, machines, manufacturing, matter compositions, means, methods or steps having the same function or capable of achieving substantially the same result as disclosed in the aforesaid embodiments. Therefore, these processes, machines, manufacturing, matter compositions, means, methods and steps fall within the scope of the appended claims of the disclosure.

What is claimed is:

1. A probe card, comprising:
a substrate;
a supporting structure disposed on the substrate, comprising:
a first layer having a first opening;
a second layer having a second opening; and
a plurality of protrusion portions disposed between the first layer and the second layer and protruding toward an inside of the first opening and an inside of the second opening; and
a probe structure electrically connected to the substrate, comprising:
a plurality of first cantilever probes each protruding and hanging from an edge of a corresponding one of the protrusion portions, wherein the first cantilever probes protrude and hang from the edges of the protrusion portions by a same length; and
a plurality of second cantilever probes each protruding and hanging from an edge of the second layer, wherein the second cantilever probes protrude and hang from the edge of the second layer by the same length, wherein the second opening is in a stepped shape from a top view perspective.

2. The probe card of claim 1, wherein the first cantilever probes are disposed along the first layer and between the protrusion portions, and the second cantilever probes are disposed along the second layer.

3. The probe card of claim 2, wherein the supporting structure further comprises:

an intermediate layer disposed between the first layer and the second layer, wherein the protrusion portions are formed on the intermediate layer.

4. The probe card of claim 3, wherein the first layer has a first surface and a second surface, with the first surface adjoining the substrate, and the second surface adjoining the intermediate layer.

5. The probe card of claim 4, wherein the intermediate layer has a first surface and a second surface, with the first surface adjoining the first layer, and the second surface adjoining the second layer.

6. The probe card of claim 5, wherein the second layer has a first surface and a second surface, with the first surface adjoining the intermediate layer, and the second cantilever probes are disposed along the second surface.

7. The probe card of claim 3, wherein the supporting structure further comprises:
a probe adjustment component disposed between the first layer and the intermediate layer and adapted to adjust the length by which the first cantilever probes protrude and hang from an edge of the intermediate layer.

8. The probe card of claim 1, wherein the first cantilever probes pass between the substrate and the first layer and are aligned with a direction of the protrusion of the protrusion portions, whereas the second cantilever probes pass between the second layer and the protrusion portions and are disposed along the second layer.

9. A supporting structure, comprising:
a body, comprising:
a first layer having a first opening; and
a second layer having a second opening,
wherein the first opening and the second opening together form a main opening; and
a plurality of protrusion portions supporting a plurality of cantilever probes, disposed at the body, and protruding toward an inside of the main opening, allowing a stepped channel to be formed in the main opening,
wherein the main opening is in a stepped shape from a top view perspective.

10. The supporting structure of claim 9, wherein the protrusion portions are formed on the first layer or the second layer.

11. The supporting structure of claim 9, wherein the body further comprises:
an intermediate layer disposed between the first layer and the second layer, wherein the protrusion portions are disposed on the intermediate layer.

12. The supporting structure of claim 9, wherein a plurality of first cantilever probes of the cantilever probes are disposed on the first layer, and a plurality of second cantilever probes of the cantilever probes are disposed on the second layer.

13. The supporting structure of claim 9, wherein the stepped channel extends in a lengthwise direction of the body.

14. A supporting structure, comprising:
a body, comprising:
a first layer having a first opening; and
a second layer having a second opening,
wherein the first opening and the second opening together form a main opening; and
a plurality of protrusion portions supporting a plurality of cantilever probes, disposed at the body and protruding toward an inside of the main opening such that defined in the main opening are:
a first channel; and a second channel with an end connected to an end of the first channel, wherein a direction of extension of the first channel is not parallel to a direction of extension of the second channel, wherein the main opening is in a stepped shape from a top view perspective.

15. The supporting structure of claim 14, wherein, in the main opening, a portion of the protrusion portions further defines:

a third channel with an end connected to another end of the first channel, wherein a direction of extension of the first channel is not parallel to a direction of extension of the third channel.

16. A probe structure, comprising:

a plurality of first cantilever probes each disposed along a side of a corresponding one of a plurality of protrusion portions of a supporting structure, with the protrusion portions protruding toward an inside of a main opening of the supporting structure, and the first cantilever probes each protrude and hang from an end of the corresponding one of the protrusion portions; and a plurality of second cantilever probes disposed on the supporting structure and along other sides of the protrusion portions, respectively, and protruding and hanging from an edge of the supporting structure, wherein the main opening is in a stepped shape from a top view perspective.

17. The probe structure of claim 16, wherein the first cantilever probes protrude and hang from edges of the protrusion portions by a same length.

18. The probe structure of claim 16, wherein the second cantilever probes protrude and hang from the edge of the supporting structure by a same length.

* * * * *